(12) United States Patent
Chae

(10) Patent No.: US 11,309,037 B2
(45) Date of Patent: Apr. 19, 2022

(54) VOLTAGE SWITCHING CIRCUIT AND SEMICONDUCTOR MEMORY DEVICE HAVING THE SAME

(71) Applicant: SK hynix Inc., Gyeonggi-do (KR)

(72) Inventor: Seung Wan Chae, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/902,878

(22) Filed: Jun. 16, 2020

(65) Prior Publication Data

US 2021/0202014 A1 Jul. 1, 2021

(30) Foreign Application Priority Data

Dec. 26, 2019 (KR) .......................... 10-2019-0175675

(51) Int. Cl.
*G11C 16/30* (2006.01)
*G11C 16/08* (2006.01)
*G11C 11/56* (2006.01)

(52) U.S. Cl.
CPC .............. *G11C 16/30* (2013.01); *G11C 16/08* (2013.01); *G11C 11/56* (2013.01)

(58) Field of Classification Search
CPC ......... G11C 16/30; G11C 16/08; G11C 11/56; G11C 16/12; G11C 16/14; H03K 17/693; H03K 17/6871; H03K 17/063; H03K 17/04206; H03K 17/04213; H03K 17/08142; H03K 19/00315; H03K 17/10; H03K 17/102; H03K 17/12; H03K 17/122; H03K 17/16; H03K 17/30; H03K 17/161; H03K 17/302; H03K 19/003; H03K 19/00307; H03K 19/00346; H03K 19/00353; H03K 19/00361; H04L 25/026

See application file for complete search history.

(56) References Cited

U.S. PATENT DOCUMENTS

| 2002/0071315 A1* | 6/2002 | Hsu .......................... G11C 8/14 365/185.26 |
| 2015/0280703 A1* | 10/2015 | Jeon .................... H03K 17/6871 327/382 |

FOREIGN PATENT DOCUMENTS

| KR | 10-0739256 | 7/2007 |
| KR | 10-2019-0017514 | 2/2019 |

* cited by examiner

*Primary Examiner* — Lincoln D Donovan
*Assistant Examiner* — Alex W Lam
(74) *Attorney, Agent, or Firm* — IP & T Group LLP

(57) ABSTRACT

A voltage switching circuit selectively transfers voltages applied to a first input terminal and a second input terminal to a first output terminal and a second output terminal. The voltage switching circuit includes a first transistor and a second transistor. The first transistor is formed on a first well on a substrate, and is coupled between the first input terminal and the first output terminal. The second transistor is formed on a second well different from the first well, and is coupled to the second input terminal. In a first mode in which a first voltage applied to the first input terminal is transferred to the first output terminal and the second output terminal, the first transistor is turned on and the second transistor is turned off.

20 Claims, 16 Drawing Sheets

VOLTAGE SWITCHING CIRCUIT AND SEMICONDUCTOR MEMORY DEVICE HAVING THE SAME

CROSS-REFERENCE TO RELATED APPLICATION

The present application claims priority under 35 U.S.C. § 119(a) to Korean patent application number 10-2019-0175675, filed on Dec. 26, 2019, which is incorporated herein by reference in its entirety.

BACKGROUND

Field of Invention

The present disclosure generally relates to an electronic device, and more particularly, to a voltage switching circuit and a semiconductor memory device having the same.

Description of Related Art

Memory devices may be formed in a two-dimensional structure in which strings are arranged horizontally to a semiconductor substrate, or be formed in a three-dimensional structure in which strings are arranged vertically to a semiconductor substrate. A three-dimensional memory device is a memory device devised to overcome the limit of degree of integration in two-dimensional memory devices, and may include a plurality of memory cells vertically stacked on a semiconductor substrate.

SUMMARY

Embodiments provide a voltage switching circuit capable of stably providing a negative voltage and a positive voltage to a plurality of planes.

Embodiments also provide a semiconductor memory device capable of stably providing a negative voltage and a positive voltage to a plurality of planes.

In accordance with an aspect of the present disclosure, there is provided a voltage switching circuit for selectively transferring voltages applied to a first input terminal and a second input terminal to a first output terminal and a second output terminal, the voltage switching circuit including: a first transistor formed on a first well on a substrate, the first transistor being coupled between the first input terminal and the first output terminal; and a second transistor formed on a second well different from the first well, the second transistor being coupled to the second input terminal, wherein, in a first mode, when a first voltage applied to the first input terminal is transferred to the first output terminal and the second output terminal, the first transistor is turned on and the second transistor is turned off.

In a second mode, when the first voltage applied to the first input terminal is transferred to the first output terminal and a second voltage applied to the second input terminal is transferred to the second output terminal, the first transistor may be turned on and the second transistor may be turned on.

The voltage switching circuit may further include a third transistor and a fourth transistor, which are formed on the first well. The third transistor may be coupled between the first input terminal and the second output terminal, and the fourth transistor may be coupled between the second transistor and the second output terminal. In the first mode, the third transistor may be turned on and the fourth transistor may be turned off. In the second mode, the third transistor may be turned off and the fourth transistor may be turned on.

In the first mode, the first voltage and the second voltage may have different polarities.

The voltage switching circuit may further include a third transistor formed on the first well and a fourth transistor formed on the second well. The third transistor and the fourth transistor may be coupled in series between the first input terminal and the second output terminal. In the first mode, the third transistor and the fourth transistor may be turned on. In the second mode, the third transistor and the fourth transistor may be turned off.

In the second mode, the first voltage and the second voltage may have different polarities.

The voltage switching circuit may further include a third transistor and a fourth transistor, which are formed on the first well, and a fifth transistor formed on the second well. The third transistor and the fifth transistor may be coupled in series between the first input terminal and the second output terminal, and the fourth transistor may be coupled between the second transistor and the second output terminal. In the first mode, the third transistor and the fifth transistor may be turned on, and the fourth transistor may be turned off. In the second mode, the third transistor and the fifth transistor may be turned off, and the fourth transistor may be turned on.

In the first mode, the first voltage and the second voltage may have different polarities.

In the second mode, the first voltage and the second voltage may have different polarities.

The first well and the second well may be p-wells.

In accordance with another aspect of the present disclosure, there is provided a voltage switching circuit for selectively transferring voltages applied to a first input terminal and a second input terminal to a first output terminal and a second output terminal, the voltage switching circuit including: a first switching circuit configured to selectively transfer a first voltage applied to the first input terminal to the second output terminal; and a second switching circuit configured to selectively transfer a second voltage applied to the second input terminal to the second output terminal, wherein the first voltage is transferred to the first output terminal, wherein at least one transistor included in the first switching circuit is formed on a well different from that on which at least one transistor included in the second switching circuit is formed.

In a first mode, the first switching circuit may be activated and the second switching circuit may be inactivated. In a second mode, the first switching circuit may be inactivated and the second switching circuit may be activated.

The first switching circuit may include a first transistor coupled between the first input terminal and the second output terminal. The second switching circuit may include: a second transistor coupled to the second input terminal; and a third transistor coupled between the second transistor and the second output terminal. The first transistor and the third transistor may be formed on a first well, and the second transistor may be formed on a second well different from the first well.

In the first mode, the first voltage and the second voltage may have different polarities.

The first switching circuit may include: a first transistor coupled to the first input terminal; and a second transistor coupled between the first transistor and the second output terminal. The second switching circuit may include a third transistor coupled between the second input terminal and the second output terminal. The first transistor may be formed on a first well, and the second transistor and the third transistor may be formed on a second well different from the first well.

In the second mode, the first voltage and the second voltage may have different polarities.

The first switching circuit may include: a first transistor coupled to the first input terminal; and a second transistor coupled between the first transistor and the second output terminal. The second switching circuit may include: a third transistor coupled to the second input terminal; and a fourth transistor coupled between the third transistor and the second output terminal. The first transistor and the fourth transistor may be formed on a first well, and the second transistor and the third transistor may be formed on a second well different from the first well.

In the first mode, the first voltage and the second voltage may have different polarities.

In the second mode, the first voltage and the second voltage may have different polarities.

In accordance with an aspect of the present disclosure, there is provided a switching circuit including: a first transistor configured to transfer a first voltage from a first input node to a first output node; second and third transistors configured to transfer, when turned on, a second voltage from a second input node to a second output node; and a fourth transistor configured to transfer, when turned on, the first voltage to the second output node, wherein the second transistor is formed on a different well from the first, third and fourth transistors, and wherein the first and second voltages have different polarities.

In accordance with an aspect of the present disclosure, there is provided a switching circuit comprising: a first transistor configured to transfer a first voltage from a first input node to a first output node; a second transistor configured to transfer, when turned on, a second voltage from a second input node to a second output node; and third and fourth transistors configured to transfer, when turned on, the first voltage to the second output node, wherein the second and fourth transistors are formed on a different well from the first and third transistors, and wherein the first and second voltages have different polarities.

In accordance with an aspect of the present disclosure, there is provided a switching circuit comprising: a first transistor configured to transfer a first voltage from a first input node to a first output node; second and third transistors configured to transfer, when turned on, a second voltage from a second input node to a second output node; and fourth and fifth transistors configured to transfer, when turned on, the first voltage to the second output node, wherein the second and fifth transistors are formed on a different well from the first, third and fourth transistors, and wherein the first and second voltages have different polarities.

BRIEF DESCRIPTION OF THE DRAWINGS

Example embodiments will now be described more fully hereinafter with reference to the accompanying drawings; however, the examples may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
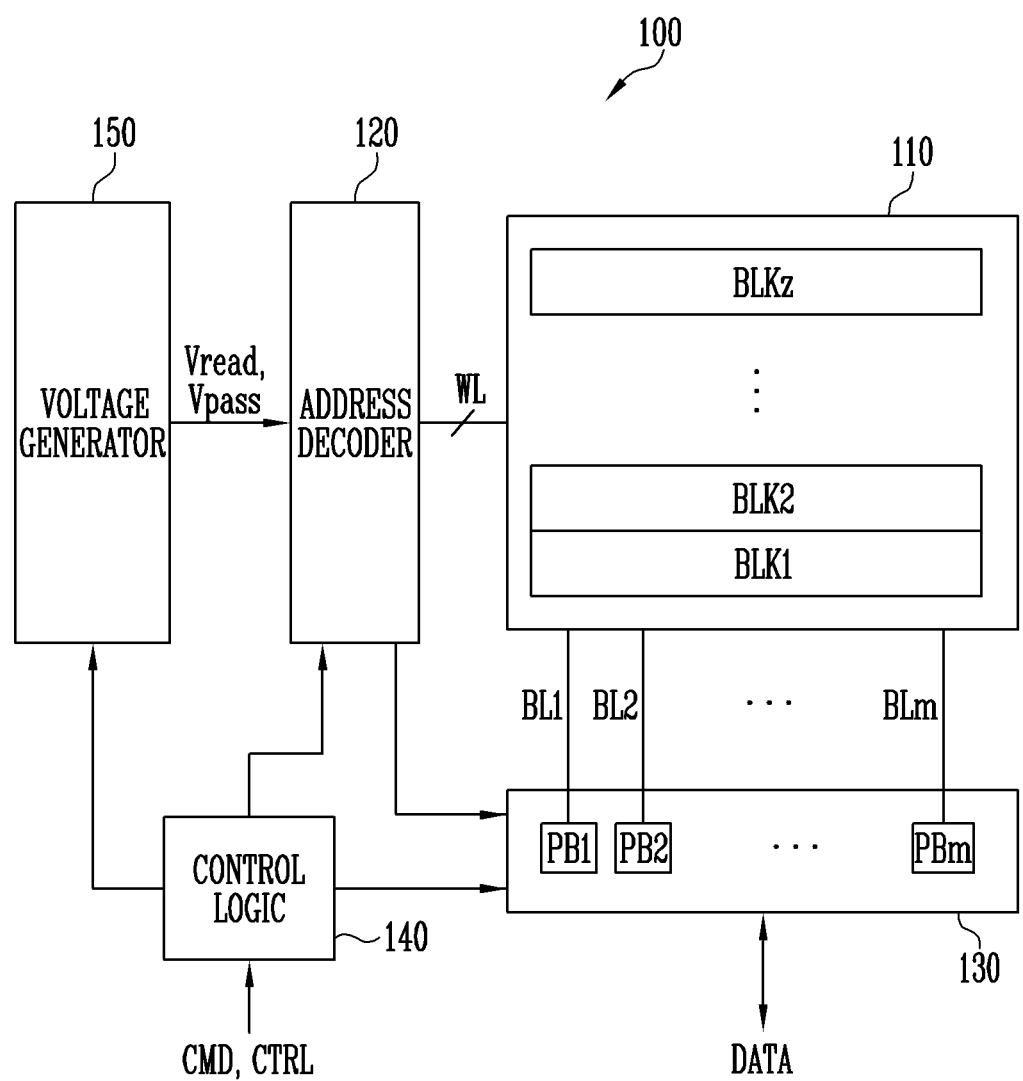
FIG. 1 is a block diagram illustrating an embodiment of a semiconductor memory device.

In the present disclosure, advantages, features and methods for achieving the advantages and features will become more apparent after a reading of the following embodiments taken in conjunction with the drawings. The present disclosure may, however, be embodied in different forms and should not be construed as being limited to the embodiments set forth herein. Rather, these embodiments are provided to describe the present disclosure in detail to the extent that those skilled in the art to which the disclosure pertains may easily enforce the technical concept of the present disclosure.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is a different disclosure.

Hereinafter, various embodiments of the present disclosure will be described in detail with reference to the accompanying drawings. The same reference numerals are used to designate the same elements as those shown in other drawings. In the following descriptions, only portions necessary for understanding operations in accordance with various embodiments may be described, and descriptions of the other portions may be omitted so as to not obscure important concepts of the embodiments.

FIG. 1 is a block diagram illustrating an embodiment of a semiconductor memory device.

Referring to FIG. 1, the semiconductor memory device 100 may include a memory cell array 110, an address decoder 120, a read/write circuit 130, a control logic 140, and a voltage generator 150.

The memory cell array 110 includes a plurality of memory blocks BLK1 to BLKz. Although not shown in detail in FIG. 1, the memory cell array 110 may include a plurality of planes, each of the plurality of planes may include a plurality of memory blocks. A configuration of a plurality of planes and memory blocks will be described later with reference to FIG. 2A, FIG. 2B and FIG. 2C.

The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz includes a plurality of memory cells.

In an embodiment, the plurality of memory cells may be nonvolatile memory cells, and the memory cell array 110 may be configured as a memory cell array having a two-dimensional structure. In another embodiment, the memory cells may be configured with nonvolatile memory cells having a vertical channel structure, and the memory cell array 110 may be configured as a memory cell array having a three-dimensional structure. Meanwhile, each of the plurality of memory cells included in the memory cell array 110 may store at least 1-bit data. In an embodiment, each of plurality of the memory cells included in the memory cell array 110 may be a single-level cell (SLC) storing 1-bit data. In another embodiment, each of the plurality of memory cells included in the memory cell array 110 may be a multi-level cell (MLC) storing 2-bit data. In still another embodiment, each of the plurality of memory cells included in the memory cell array 110 may be a triple-level cell (TLC) storing 3-bit data. In still another embodiment, each of the plurality of memory cells included in the memory cell array 110 may be a quadruple-level cell (QLC) storing 4-bit data. In some embodiments, the memory cell array 110 may include a plurality of memory cells each storing 5-or-more bit data.

The address decoder 120, the read/write circuit 130, the control logic 140, and the voltage generator 150 operate as a peripheral circuit for driving the memory cell array 110. The address decoder 120 is coupled to the memory cell array 110 through the word lines WL. The address decoder 120 operates under the control of the control logic 140. The address decoder 120 receives an address through a global word line decoder (not shown), a plane decoder, and an input/output buffer (not shown) in the semiconductor memory device 100.

The address decoder 120 decodes a block address among received addresses. The address decoder 120 selects at least one memory block according to the decoded block address. Also, in a read voltage application operation during a read operation, the address decoder 120 applies a read voltage Vread generated by the voltage generator 150 to a selected word line of the selected memory block, and applies a pass voltage Vpass generated by the voltage generator 150 to the other unselected word lines. Also, in a program verify operation, the address decoder 120 applies a verify voltage generated by the voltage generator 150 to the selected word line of the selected memory block, and applies the pass voltage Vpass to the other unselected word lines.

The address decoder 120 decodes a column address among the received addresses. The address decoder 120 transmits the decoded column address to the read/write circuit 130.

Read and program operations of the semiconductor memory device 100 are performed in a unit of a page. Addresses received in a request for the read and program operations include a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation, and operate as a "write circuit" in a write operation. The plurality of page buffers PB1 to PBm are coupled to the memory cell array 110 through the bit lines BL1 to BLm. In order to sense threshold voltages of the memory cells in a read operation or a program verify operation, the plurality of page buffers PB1 to PBm supply sensing current to the bit lines coupled to the memory cells, and each page buffer senses, through a sensing node, a change in amount of current flowing depending on a program state of a corresponding memory cell and then latches the sensed change as sensing data. The read/write circuit 130 operates in response to page buffer control signals output from the control logic 140.

In a read operation, the read/write circuit 130 senses data of the memory cells and temporarily stores read data, and then outputs data DATA to the input/output buffer (not shown) of the semiconductor memory device 100. In an embodiment, the read/write circuit 130 may include a column select circuit and the like as well as the page buffers (or page registers).

The control logic 140 is coupled to the address decoder 120, the read/write circuit 130, and the voltage generator 150. The control logic 140 receives a command CMD and a control signal CTRL though the input/output buffer (not shown) of the semiconductor memory device 100. The control logic 140 controls a general operation of the semiconductor memory device 100 in response to the control signal CTRL. Also, the control logic 140 outputs a control signal for adjusting sensing node precharge potential levels of the plurality of page buffers PB1 to PBm. The control logic 140 may control the read/write circuit 130 to perform a read operation of the memory cell array 110.

The voltage generator 150 generates a read voltage Vread and a pass voltage Vpass in a read operation in response to a control signal output from the control logic 140. Although not shown in FIG. 1, the voltage generator 150 may generate other voltages for various operations of the memory cell array 110, in addition to the read voltage Vread and the pass voltage Vpass. For example, the voltage generator 150 may generate various voltages including a program voltage, a verify voltage, an erase voltage, and the like.

The memory cell array 110 shown in FIG. 1 may be configured with one plane, or may be configured with a plurality of planes. When the memory cell array 110 is configured with a plurality of planes, a plurality of read/write circuits may be configured to correspond to the respective planes. An interleaving operation may be performed on the plurality of planes. However, in order to perform operations on the respective planes, the voltage generator 150 is to supply an operation voltage to each of the plurality of planes.

In an embodiment, the voltage generator 150 may include a voltage switching circuit for switching a voltage to be supplied to each of the plurality of planes. The voltage switching circuit may switch a voltage to be supplied to each of the plurality of planes and transfer the switched voltage to the address decoder 120 through a global word line. The address decoder 120 may decode a voltage received through the global line and transfer the decoded voltage to the memory cell array 110 through a local word line. The word line WL shown in FIG. 1 may be the local word line.

Figure 2A:
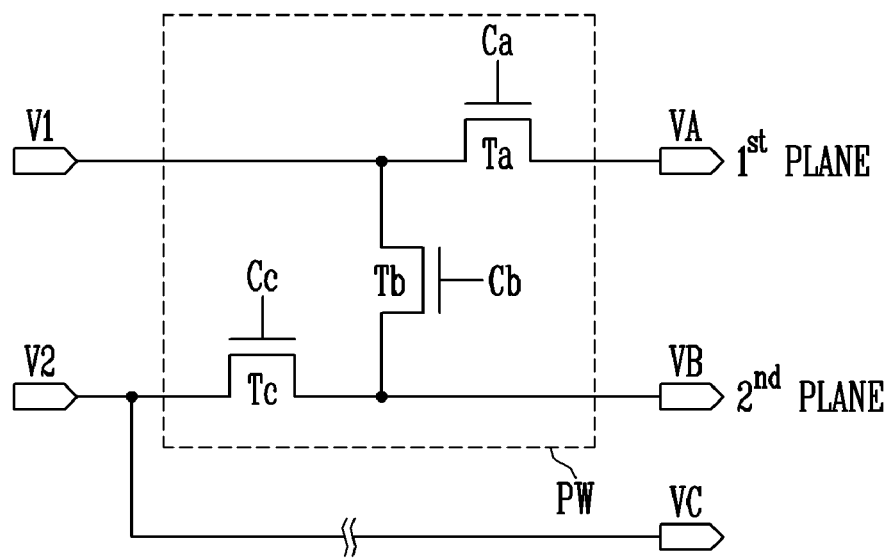
FIG. 2A is a circuit diagram illustrating a voltage switching circuit in accordance with a first embodiment of the present disclosure.

FIG. 2A is a circuit diagram illustrating a voltage switching circuit in accordance with a first embodiment of the present disclosure.

Referring to FIG. 2A, the voltage switching circuit in accordance with the first embodiment of the present disclosure may include three transistors Ta, Tb, and Tc. The transistors, i.e., first, second, and third transistors Ta, Tb, and Tc may be turned on or turned off respectively by corresponding first, second, and third control signals Ca, Cb, and Cc. The voltage switching circuit is supplied with operating voltages from first and second input terminals V1 and V2 to output the operating voltages to first and second output terminals VA and VB. The operating voltages input to the first and second input terminals V1 and V2 may be transferred from a plurality of voltage pumps in the voltage generator 150. In addition, the operating voltages output to the first and second output terminals VA and VB may be transferred to a global word line. The operating voltage output to the first output terminal VA may be transferred to a first plane. In addition, the operating voltage output to the second output terminal VB may be transferred to a second plane. The first, second, and third transistors Ta, Tb, and Tc may be formed on one p-well PW.

According to an operation mode of the voltage switching circuit, the operating voltages input to the first and second input terminals V1 and V2 may be output to the first and second output terminals VA and VB in various manners. For example, in a first mode of the voltage switching circuit, the operating voltage input to the first input terminal VA may be transferred to the first and second output terminals VA and VB. The operating voltage input to the second input terminal V2 may be output to another output terminal VC except the first and second output terminals VA and VB.

When a voltage having a positive value is transferred from the first input terminal V1 to the first and second output terminals VA and VB, and simultaneously, a voltage having a negative value is transferred from the second input terminal V2 to the another output terminal VC, a leakage current may be generated from the transistor Tc located adjacent to the second input terminal V2. Therefore, power consumption of the semiconductor memory device 100 may be increased, and the voltage input to the second input terminal V2 may be unstable.

In another example, in a second mode of the voltage switching circuit, the operating voltage input to the first input terminal V1 may be transferred to the first output terminal VA, and the operating voltage input to the second input terminal V2 may be transferred to the second output terminal VB.

When a voltage having a positive value is transferred from the first input terminal V1 to the first output terminal VA, and simultaneously, a voltage having a negative value is transferred from the second input terminal V2 to the second output terminal VB, a leakage current may be generated from the transistor Tb located adjacent to the second output terminal VB. Therefore, power consumption of the semiconductor memory device 100 may be increased, and the voltage output to the second output terminal VB may be unstable.

According to the semiconductor memory device in accordance with an embodiment of the present disclosure, when voltages respectively input to the first input terminal and the second input terminal have different polarities, a leakage current can be prevented from being generated from a transistor adjacent to any one of the input and output terminals V1, V2, VA, and VB.

Figure 2B:
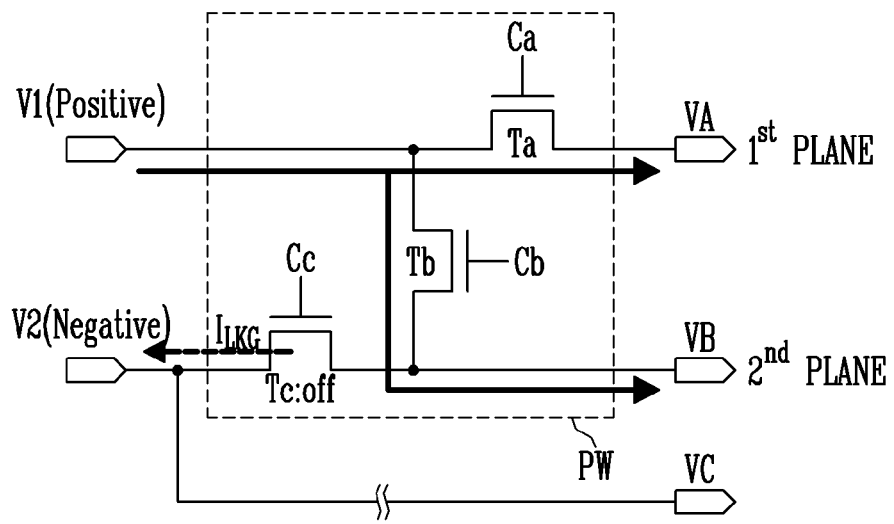
FIG. 2B is a diagram illustrating a leakage current generated in a case where a positive voltage input to a first input terminal is transferred to first and second output terminals and a negative voltage is applied to a second input terminal in the voltage switching circuit shown in FIG. 2A.

FIG. 2B is a diagram illustrating a leakage current generated in a case where a positive voltage input to the first input terminal is transferred to the first and second output terminals, and a negative voltage is applied to the second input terminal in the voltage switching circuit shown in FIG. 2A. That is, FIG. 2B is a diagram illustrating a leakage current generated in an operation of the voltage switching circuit in the first mode.

Referring to FIG. 2B, a positive voltage is applied to the first input terminal V1, and a negative voltage is applied to the second input terminal. Since the voltage switching circuit operates in the first mode, the positive voltage applied to the first input terminal V1 is transferred to the first and second output terminals VA and VB. To this end, the first and second transistors Ta and Tb are turned on, and the third transistor Tc is turned off. The first to third transistors Ta, Tb, and Tc may be implemented with an NMOS transistor. Therefore, the first and second control signals Ca and Cb may have a logical value of a high level, and the third control signal Cc may have a logical value of a low level. The negative voltage input to the second input terminal V2 may be transferred to the another output terminal VC through another path (not shown) in the voltage switching circuit.

Although the third transistor Tc is turned off, a leakage current $I_{LKG}$ may be generated toward the second input terminal V2 from the third transistor Tc. This is because the first to third transistors Ta to Tc are formed on one p-well PW, and the second input terminal V2 receiving a voltage having a negative value and the third transistor Tc are coupled to each other. The leakage current $I_{LKG}$ generated in the case shown in FIG. 2B will be described in more detail with reference to FIG. 3A.

Figure 2C:
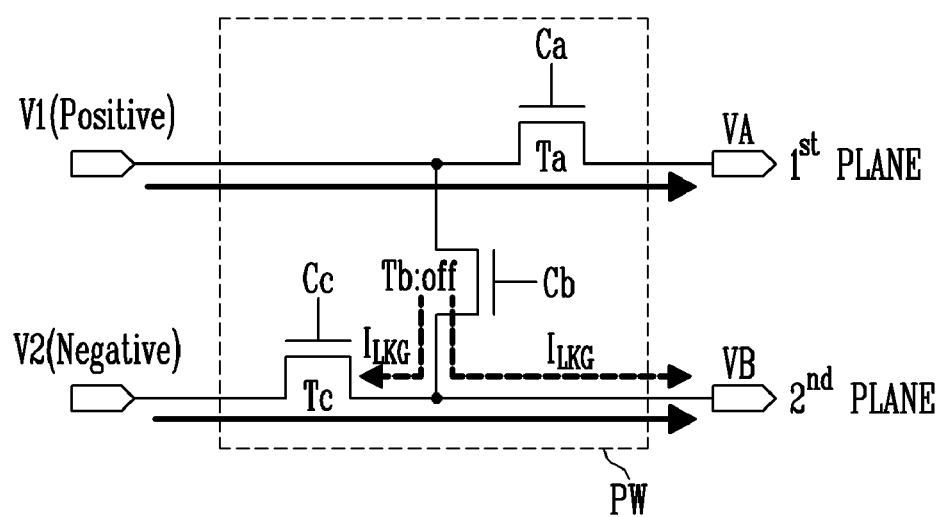
FIG. 2C is a diagram illustrating a leakage current generated in a case where a positive voltage input to the first input terminal is transferred to the first output terminal and a negative voltage input to the second input terminal is transferred to the second output terminal in the voltage switching circuit shown in FIG. 2A.

FIG. 2C is a diagram illustrating a leakage current generated in a case where a positive voltage input to the first input terminal is transferred to the first output terminal and a negative voltage input to the second input terminal is transferred to the second output terminal in the voltage switching circuit shown in FIG. 2A. That is, FIG. 2C is a diagram illustrating a leakage current generated in an operation of the voltage switching circuit in the second mode.

Referring to FIG. 2C, a positive voltage is applied to the first input terminal V1, and a negative voltage is applied to the second input terminal V2. Since the voltage switching circuit operates in the second mode, the positive voltage applied to the first input terminal V1 is transferred to the first output terminal VA, and the negative voltage applied to the second input terminal V2 is transferred to the second output terminal VB. To this end, the first and third transistors Ta and Tc are turned on, and the second transistor Tb is turned off. The first to third transistors Ta, Tb, and Tc may be implemented with an NMOS transistor. Therefore, the first and third control signals Ca and Cc may have a logical value of a high level, and the second control signal Cb may have a logical value of a low level.

Although the second transistor Tb is turned off, a leakage current $I_{LKG}$ may be generated toward the second output terminal VB and the second input terminal V2 from the second transistor Tb. This is because the first to third transistors Ta to Tc are formed on one p-well PW, and the second input terminal V2 and the second output terminal VB, which receive a voltage having a negative value, are coupled to the second transistor Tb. The leakage current $I_{LKG}$ generated in the case shown in FIG. 2C will be described in more detail with reference to FIG. 3B.

Figure 3A:
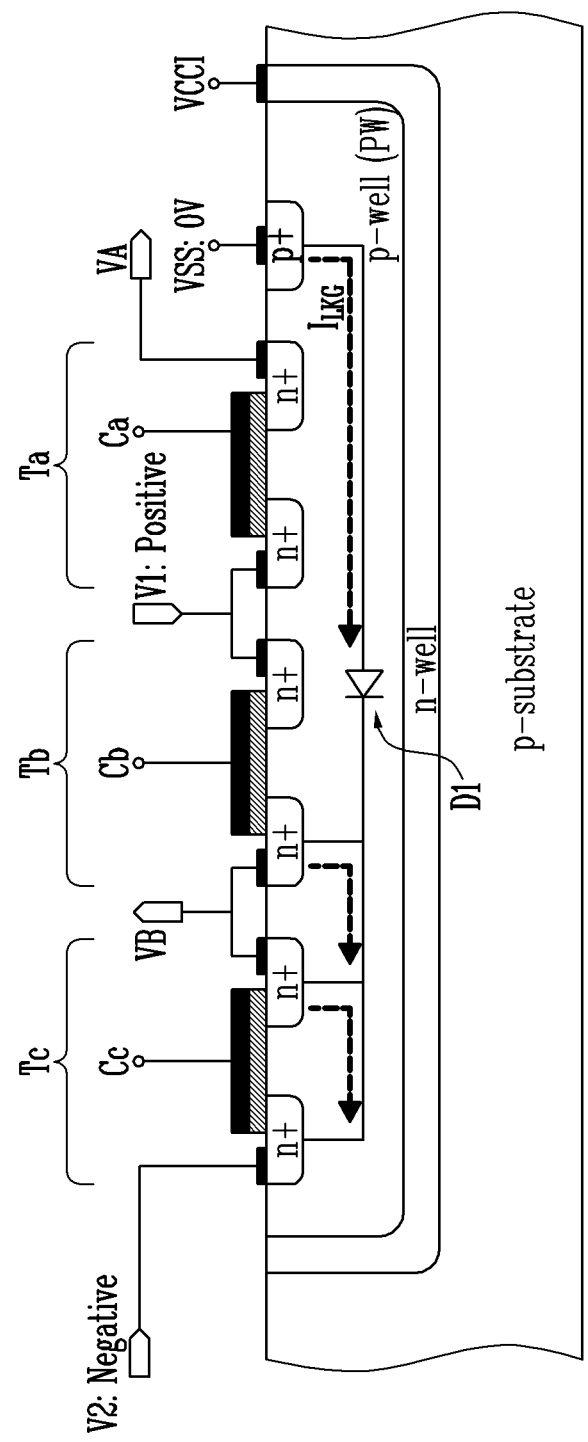
FIG. 3A is a diagram illustrating a leakage current generated in the case shown in FIG. 2B.

FIG. 3A is a diagram illustrating a leakage current generated in the case shown in FIG. 2B.

Referring to FIG. 3A, a sectional view of the transistors Ta, Tb, and Tc constituting the voltage switching circuit shown in FIG. 2B is illustrated. More specifically, a p-well PW is formed in an n-well formed on a p-substrate, and the first to third transistors Ta, Tb, and Tc are formed in the p-well PW.

As shown in FIGS. 2B and 3A, the first input terminal V1 is coupled to a first terminal of the first transistor Ta and a first terminal of the second transistor Tb. The first output terminal VA is coupled to a second terminal of the first transistor Ta. The second input terminal V2 is coupled to a first terminal of the third transistor Tc. The second output terminal VB is coupled to a second terminal of the second transistor Tb and a second terminal of the third transistor Tc. The first and second terminals of each of the first to third transistors Ta to Tc may be formed as an n+ region doped with a high concentration.

In addition, the first to third control signals Ca to Cc are respectively input to gate terminals of the first to third transistors Ta to Tc. Meanwhile, a body of the first to third transistors Ta to Tc, i.e., the p-well PW in which the first to third transistors Ta to Tc are formed is coupled to a VSS terminal. The VSS terminal may be formed as a p+ region doped with a high concentration.

Since the voltage switching circuit operates in the first mode, a positive voltage is applied to the first input terminal V1 to be transferred to the first and second output terminals VA and VB through the first and second transistors Ta and Tb. In order to prevent a body effect, a ground voltage of 0V may be applied to the VSS terminal coupled to the p-well PW. In this situation, when a negative voltage is applied to the first terminal of the third transistor Tc coupled to the second input terminal V2, a P-N junction diode D1 is formed between the VSS terminal which is a p+ doped region and the first terminal of the third transistor Tc, which is an n+ doped region, as shown in FIG. 3A. Therefore, a leakage current $I_{LKG}$ is generated toward the second input terminal V2 having a relatively low voltage (negative voltage) from the VSS terminal having a relatively high voltage (i.e., 0V). Accordingly, as shown in FIG. 2B, the leakage current $I_{LKG}$ is generated toward the second input terminal V2 even when the third transistor Tc is in a turn-off state.

Meanwhile, a voltage of 0V as the third control signal Cc is input to the gate electrode of the third transistor Tc, and therefore, a leakage current is also generated toward the second input terminal V2 from the second terminal of the second transistor Tb and the second terminal of the third transistor Tc, which are coupled to the second output terminal VB.

Figure 3B:
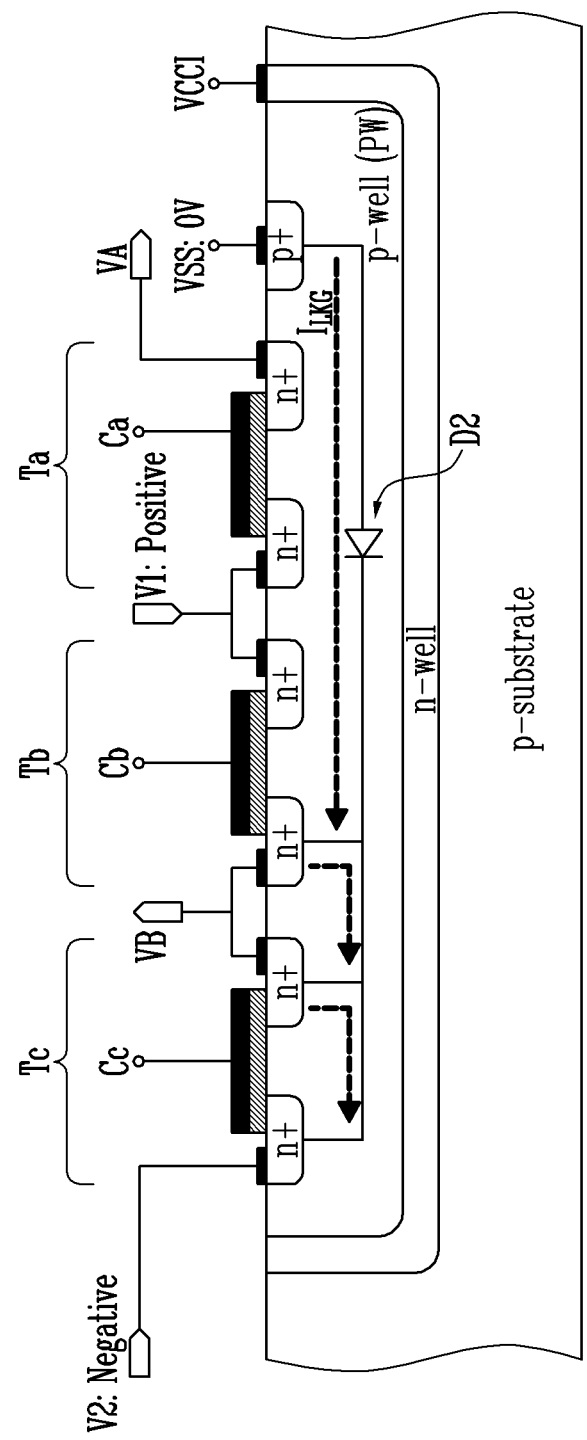
FIG. 3B is a diagram illustrating a leakage current generated in the case shown in FIG. 2C.

FIG. 3B is a diagram illustrating a leakage current generated in the case shown in FIG. 2C.

Referring to FIG. 3B, a sectional view of the transistors Ta, Tb, and Tc constituting the voltage switching circuit shown in FIG. 2C is illustrated. A configuration of the voltage switching circuit shown in FIG. 3B is identical to that shown in FIG. 3A, and therefore, overlapping descriptions will be omitted.

Since the voltage switching circuit operates in the second mode, a positive voltage is applied to the first input terminal V1 to be transferred to the first output terminal VA through the first transistor Ta, and a negative voltage is applied to the second input terminal V2 to be transferred to the second output terminal VB through the third transistor Tc. The first and third transistors Ta and Tc may be turned on, and the second transistor Tb may be turned off. In order to prevent a body effect, a ground voltage of 0V may be applied to the VSS terminal coupled to the p-well PW. In this situation, when a negative voltage is applied to the first terminal of the third transistor Tc coupled to the second input terminal V2, a negative voltage is transmitted to the second terminal of the third transistor Tc and the second output terminal VB, when the third transistor Tc is turned on.

Therefore, as shown in FIG. 3B, a P-N junction diode D2 is formed between the VSS terminal which is a p+ doped region, and the first and second terminals of the third transistor Tc and the second terminal of the second transistor Tb, each of which is an n+ doped region. Therefore, a leakage current $I_{LKG}$ is generated toward the second input terminal V2 and the second output terminal VB, which have a relatively low voltage (negative voltage) from the VSS terminal having a relatively high voltage (i.e., 0V). Accordingly, as shown in FIG. 2C, the leakage current $I_{LKG}$ is generated toward the second input terminal V2 and the second output terminal VB even when the second transistor Tb is in the turn-off state.

Meanwhile, although not shown in detail in FIG. 3B, a voltage of 0V as the second control signal Cb is input to the gate electrode of the second transistor Tb, and therefore, a leakage current is also generated toward the second output terminal VB from the first terminal of the first transistor Ta and the first terminal of the second transistor Tb.

According to the voltage switching circuit in accordance with an embodiment of the present disclosure, a transistor directly coupled to the first input terminal and a transistor directly coupled to the second input terminal are formed in different wells, so that the generation of a leakage current can be prevented even when voltages having different polarities are supplied to the first and second input terminals.

Figure 4:
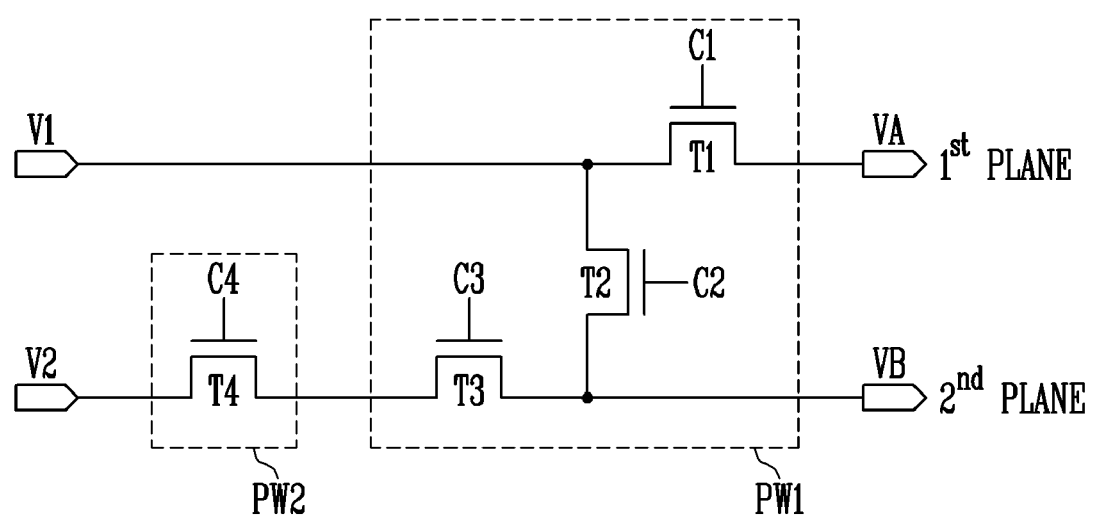
FIG. 4 is a circuit diagram illustrating a voltage switching circuit in accordance with a second embodiment of the present disclosure.
Figure 5:
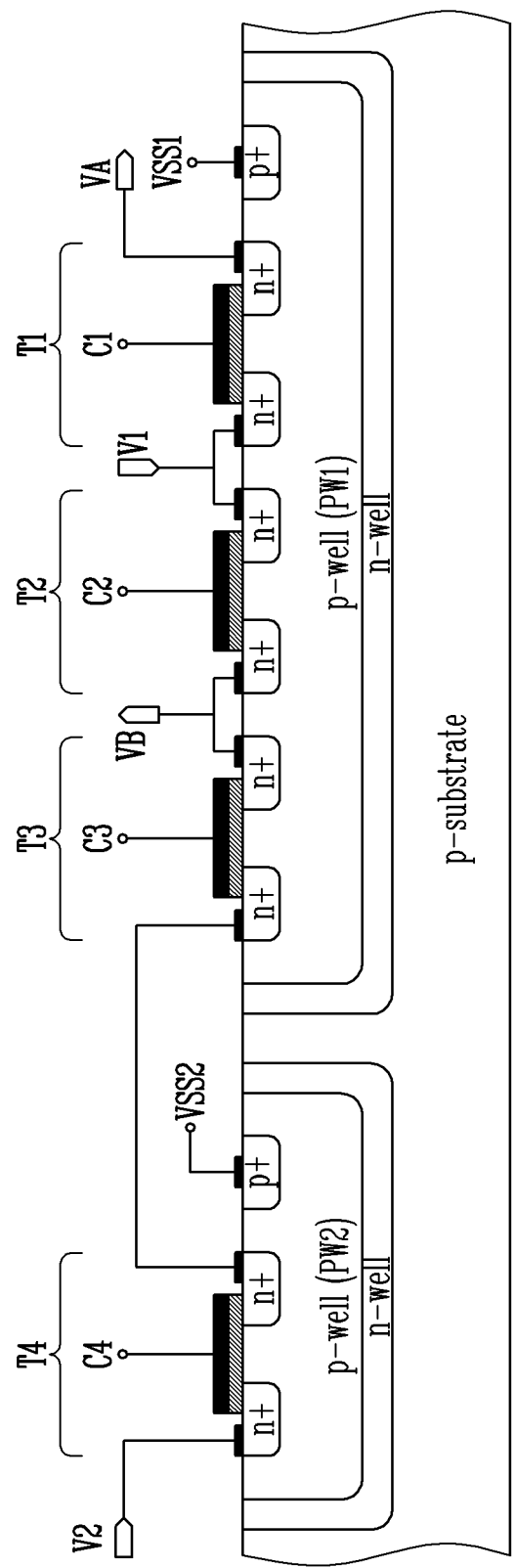
FIG. 5 is a sectional view illustrating a case where transistors shown in FIG. 4 are formed on an actual substrate.

FIG. 4 is a circuit diagram illustrating a voltage switching circuit in accordance with a second embodiment of the present disclosure. Meanwhile, FIG. 5 is a sectional view illustrating a case where transistors shown in FIG. 4 are formed on an actual substrate. Hereinafter, the voltage switching circuit in accordance with the second embodiment of the present disclosure will be described with reference to FIGS. 4 and 5 together.

Referring to FIG. 4, the voltage switching circuit in accordance with the second embodiment of the present disclosure is coupled to a first input terminal V1, a second input terminal V2, a first output terminal VA, and a second output terminal VB. Meanwhile, the voltage switching circuit in accordance with the second embodiment of the present disclosure includes first to fourth transistors T1 to T4. The first to fourth transistors T1 to T4 are respectively controlled by first to fourth control signals C1 to C4.

The first transistor T1 is coupled between the first input terminal V1 and the first output terminal VA. The second transistor T2 is coupled between the first input terminal V1 and the second output terminal VB. The third and fourth transistors T3 and T4 are sequentially coupled in series between the second output terminal VB and the second input terminal V2. Referring to FIG. 5 together with FIG. 4, the first input terminal V1 is coupled to a first terminal of the first transistor T1 and a first terminal of the second transistor T2. A second terminal of the first transistor T1 is coupled to a first output terminal VA. Meanwhile, the second output terminal VB is coupled to a second terminal of the second transistor T2 and a first terminal of the third transistor T3. In addition, the second input terminal V2 is coupled to a first terminal of the fourth transistor T4. A second terminal of the fourth transistor T4 is coupled to a second terminal of the third transistor T3.

The first to third transistors T1 to T3 included in the voltage switching circuit in accordance with the second embodiment of the present disclosure are formed in a first p-well PW1. Meanwhile, the fourth transistor T4 is formed in a second p-well PW2. That is, the fourth transistor T4 is formed in a well different from that in which the first to third transistors T1 to T3 are formed. The first and second terminals of each of the first to third transistors T1 to T3 may be formed as n+ regions doped with a high concentration in the first p-well PW1. The first and second terminals of the fourth transistor T4 may be formed as n+ regions doped with a high concentration in the second p-well PW2.

In addition, the first to fourth control signals C1 to C4 are respectively input to gate terminals of the first to fourth transistors T1 to T4. Meanwhile, a body of the first to third transistors T1 to T3, i.e., the first p-well PW1 in which the first to third transistors T1 to T3 are formed is coupled to a first VSS terminal VSS1. In addition, a body of the fourth transistor T4, i.e., the second p-well PW2 in which the fourth transistor T4 is formed is coupled to a second VSS terminal VSS2. The first and second VSS terminals VSS1 and VSS2 may be formed as p+ regions doped with a high concentration.

In FIG. 4, when the voltage switching circuit in accordance with the second embodiment of the present disclosure operates in a first mode, a voltage applied to the first input terminal V1 is transferred to the first and second output terminals VA and VB. Meanwhile, when the voltage switching circuit operates in a second mode, a voltage applied to the first input terminal V1 is transferred to the first output terminal VA, and a voltage applied to the second input terminal V2 is transferred to the second output terminal VB. The first transistor T1 is turned on under both the first mode and the second mode. The third and fourth transistors T3 and T4 are turned off in the first mode, and are turned on in the second mode. Therefore, the transistor T2 which is turned on in the first mode and is turned off in the second mode may be referred to as a "first switching circuit." Meanwhile, the third and fourth transistors T3 and T4 which are turned off in the first mode and are turned on in the second mode may be referred to as a "second switching circuit."

As shown in FIGS. 4 and 5, according to the voltage switching circuit in accordance with the second embodiment of the present disclosure, the first transistor T1 coupled between the first input terminal V1 and the first output terminal VA, the second transistor T2 coupled between the first input terminal V1 and the second output terminal VB, and the third transistor T3 coupled to the second output terminal VB are formed on the first p-well PW1. In addition, the fourth transistor T4 coupled to the second input terminal V2 is formed on the second p-well PW2. Accordingly, the generation of a leakage current can be prevented even when voltages having different polarities are applied to the first input terminal V1 and the second input terminal V2 in the first mode.

Figure 6:
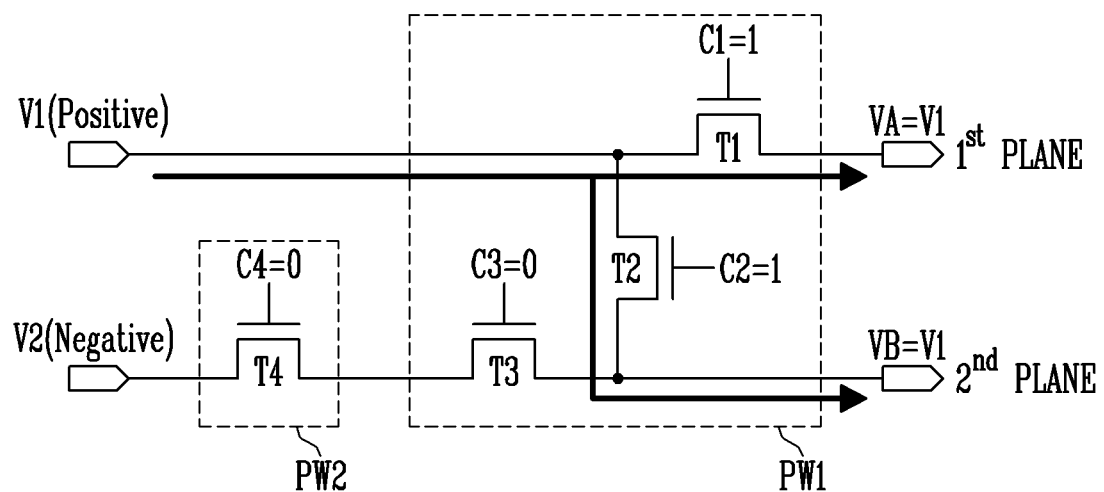
FIG. 6 is a diagram illustrating an operation of the voltage switching circuit in a first mode in accordance with the second embodiment of the present disclosure.

FIG. 6 is a diagram illustrating an operation of the voltage switching circuit in the first mode in accordance with the second embodiment of the present disclosure. When the voltage switching circuit operates in the first mode, a voltage applied to the first input terminal V1 is transferred to the first and second output terminals VA and VB. Therefore, the first switching circuit is activated. To this end, the first and second control signals C1 and C2 have a logical value of 1. Accordingly, the first and second transistors T1 and T2 are turned on. Meanwhile, in the first mode, a voltage applied to the second input terminal V2 may be output to another output terminal (not shown) except the first and second output terminal VA and VB. Accordingly, the second switching circuit is inactivated in the first mode. To this end, the third and fourth control signals C3 and C4 have a logical value of 0. Accordingly, the third and fourth transistors T3 and T4 are turned off.

A situation in which a positive voltage is applied to the first input terminal V1 and a negative voltage is applied to the second input terminal V2 has been described in FIG. 6. Referring to FIG. 5 together with FIG. 6, a ground voltage, i.e., a voltage of 0V may be applied to the first VSS terminal VSS1 coupled to the p+ region of the first p-well PW1. Accordingly, a body effect of the first to third transistors T1 to T3 on the first p-well PW1 can be prevented.

Meanwhile, since the negative voltage is applied to the second input terminal V2, a negative voltage is applied to the second VSS terminal VSS2 coupled to the p+ region of the second p-well PW2 to prevent the generation of a leakage current. Accordingly, unlike as described with reference to FIG. 3A or 3B, leakage current is not generated between a p+ doping region of the second p-well PW2, on which the fourth transistor T4 is formed, and the second input terminal V2. Meanwhile, since the fourth transistor T4 is in the turn-off state, the negative voltage applied to the second input terminal V2 is not transferred to the third transistor T3. Accordingly, unlike as described with reference to FIG. 3A or 3B, leakage current is not generated between a p+ doping region of the first p-well PW1, on which the third transistor T3 is formed, and the second terminal of the third transistor T3.

Even when a negative voltage is applied to the first input terminal V1 and a positive voltage is applied to the second input terminal V2, leakage current is not generated. This is because the third and fourth transistors T3 and T4 turned off in the first mode are formed on different p-wells.

Moreover, in the first mode, leakage current is not generated even when positive voltages are applied to both the first and second input terminals V1 and V2, or when negative voltages are applied to both the first and second input terminals V1 and V2.

Figure 7:
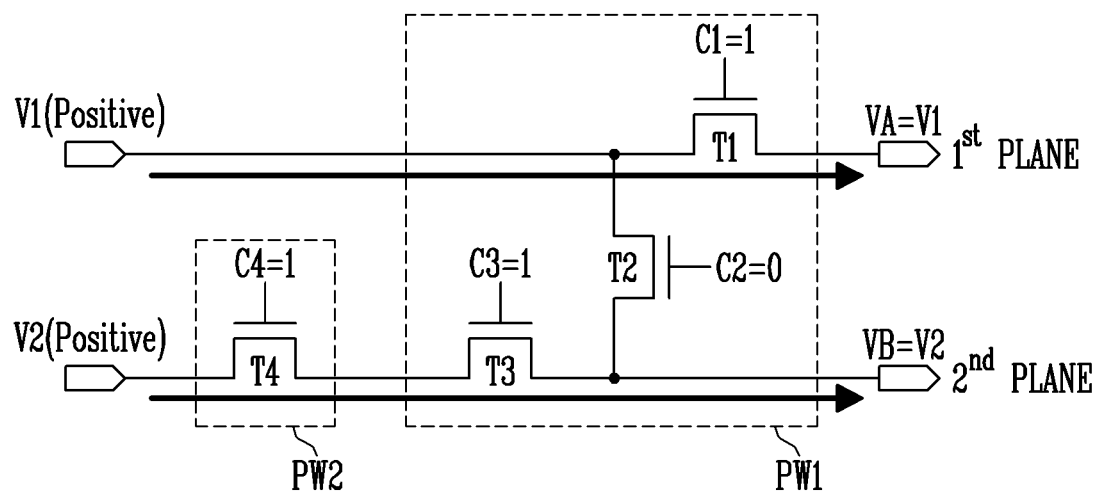
FIG. 7 is a diagram illustrating an operation of the voltage switching circuit in a second mode in accordance with the second embodiment of the present disclosure.

FIG. 7 is a diagram illustrating an operation of the voltage switching circuit in the second mode in accordance with the second embodiment of the present disclosure. When the voltage switching circuit operates in the second mode, a voltage applied to the first input terminal V1 is transferred to the first output terminal VA, and a voltage applied to the second input terminal V2 is transferred to the second output terminal VB. That is, the first switching circuit is inactivated, and the second switching circuit is activated. To this end, the first, third, and fourth control signals C1, C3, and C4 have a logical value of 1. Accordingly, the first, third, and fourth transistors T1, T3, and T4 are turned on. Meanwhile, the second control signal C2 has a logical value of 0, and the second transistor T2 is turned off.

A situation in which positive voltages are applied to both the first and second input terminals V1 and V2 is illustrated in FIG. 7. Therefore, leakage current is not generated. Referring to FIG. 5 together with FIG. 7, a ground voltage, i.e., a voltage of 0V may be applied to the first VSS terminal VSS1 coupled to the p+ region of the first p-well PW1 and the second VSS terminal VSS2 coupled to the p+ region of the second p-well PW2. Accordingly, a body effect of the first to fourth transistors T1 to T4 on the first and second p-wells PW1 and PW2 can be prevented.

In the second mode, leakage current is not generated in a situation in which negative voltages are applied to both the first and second input terminals V1 and V2. A negative voltage is applied to the first VSS terminal VSS1 coupled to the p+ region of the first p-well PW1 and the second VSS terminal VSS2 coupled to the p+ region of the second p-well PW2, so that the body effect of the first to fourth transistors T1 to T4 can be prevented.

In the second mode, when a positive voltage is applied to the first input terminal V1 and a negative voltage is applied to the second input terminal V2, a ground voltage may be applied to the first VSS terminal VSS1 coupled to the p+ region of the first p-well PW1. In addition, the negative voltage applied to the second input terminal V2 may be transferred to the second terminal of the third transistor T3 through the fourth transistor T4. Therefore, a leakage current $I_{LKG}$ is generated toward the second terminal of the third transistor T3, which has a relatively low voltage (negative voltage) from the first VSS terminal VSS1 having a relatively high voltage (i.e., 0V). Furthermore, since the fourth transistor M4 is also turned on, the negative voltage may be transferred to the first terminal of the fourth transistor T4 and the second output terminal VB. Therefore, a leakage current $I_{LKG}$ is generated toward the second output terminal VB having a relatively low voltage (negative voltage) from the first VSS terminal VSS1 having a relatively high voltage (i.e., 0V).

In the second mode, when a negative voltage is applied to the first input terminal V1 and a positive voltage is applied to the second input terminal V2, leakage current may not generated. However, since a negative voltage is applied to the first VSS terminal VSS1, a threshold voltage of the third transistor T3 is increased due to the body effect. Therefore, when the voltage switching circuit in accordance with the second embodiment of the present disclosure operates in the second mode, and simultaneously, a negative voltage and a positive voltage are respectively applied to the first input terminal V1 and the second input terminal V2, the turn-on and turn-off of the third transistor T3 may not be easily controlled.

The operation mode of the voltage switching circuit in accordance with the second embodiment of the present disclosure and the generation of a leakage current under input terminal conditions are summarized as shown in the following Table 1.

TABLE 1

| Mode | V1 | V2 | VSS1 | VSS2 | Generation of leakage current |
|---|---|---|---|---|---|
| First mode (VA = VB = V1) | (+) Positive | (+) Positive | 0 V | 0 V | X |
| | (+) Positive | (−) Negative | 0 V | (−) | X |
| | (−) Negative | (+) Positive | (−) | 0 V | X |
| | (−) Negative | (−) Negative | (−) | (−) | X |
| Second mode (VA = V1, VB = V2) | (+) Positive | (+) Positive | 0 V | 0 V | X |
| | (+) Positive | (−) Negative | 0 V | (−) | ○ |
| | (−) Negative | (+) Positive | (−) | 0 V | X |
| | (−) Negative | (−) Negative | (−) | (−) | X |

Thus, in the voltage switching circuit in accordance with the second embodiment of the present disclosure, leakage current is not generated even when voltages having the same polarity or voltages having different polarities are applied to the input terminals V1 and V2 in the first mode. Moreover, in the voltage switching circuit in accordance with the second embodiment of the present disclosure, leakage current is not generated when voltages having the same polarity are applied to the input terminals V1 and V2 in the second mode.

In the voltage switching circuit in accordance with the second embodiment of the present disclosure, when a positive voltage is applied to the first input terminal V1 and a negative voltage is applied to the second input terminal V2 in the second mode, a leakage current may be generated. Furthermore, in the voltage switching circuit in accordance with the second embodiment of the present disclosure, when a negative voltage is applied to the first input terminal V1 and a positive voltage is applied to the second input terminal V2 in the second mode, the third transistor T3 may not be easily controlled according to the body effect.

Figure 8:
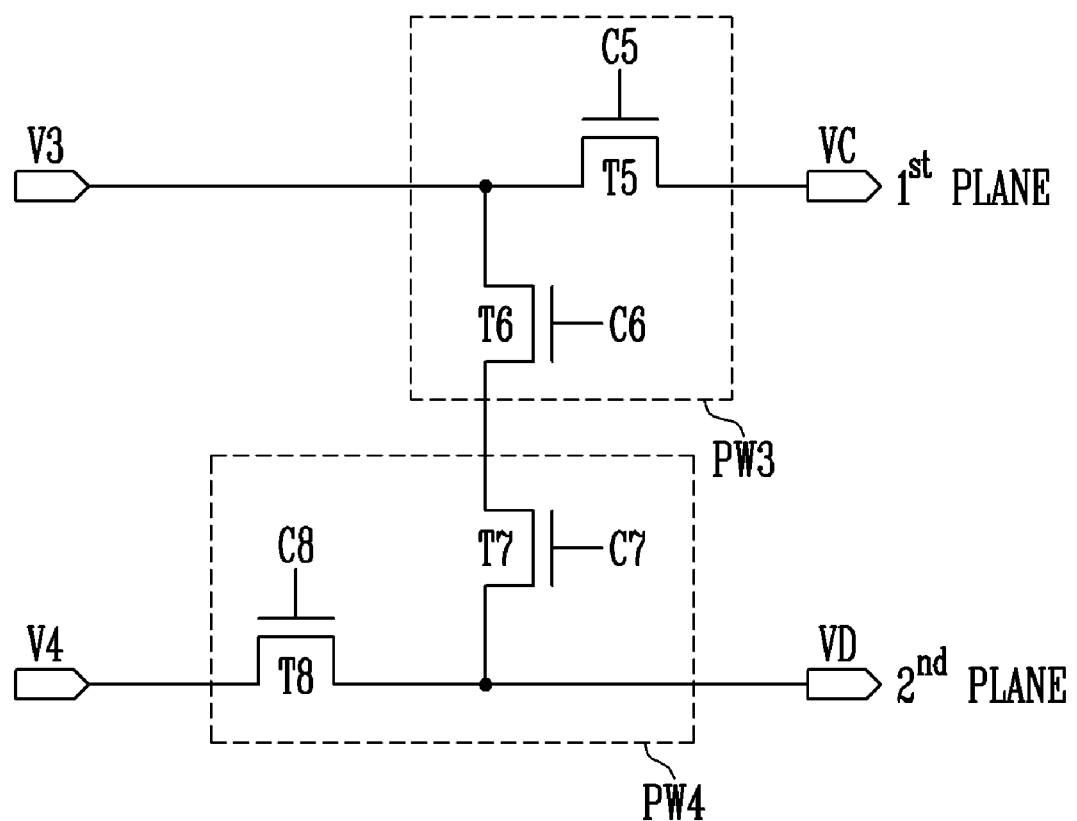
FIG. 8 is a circuit diagram illustrating a voltage switching circuit in accordance with a third embodiment of the present disclosure.
Figure 9:
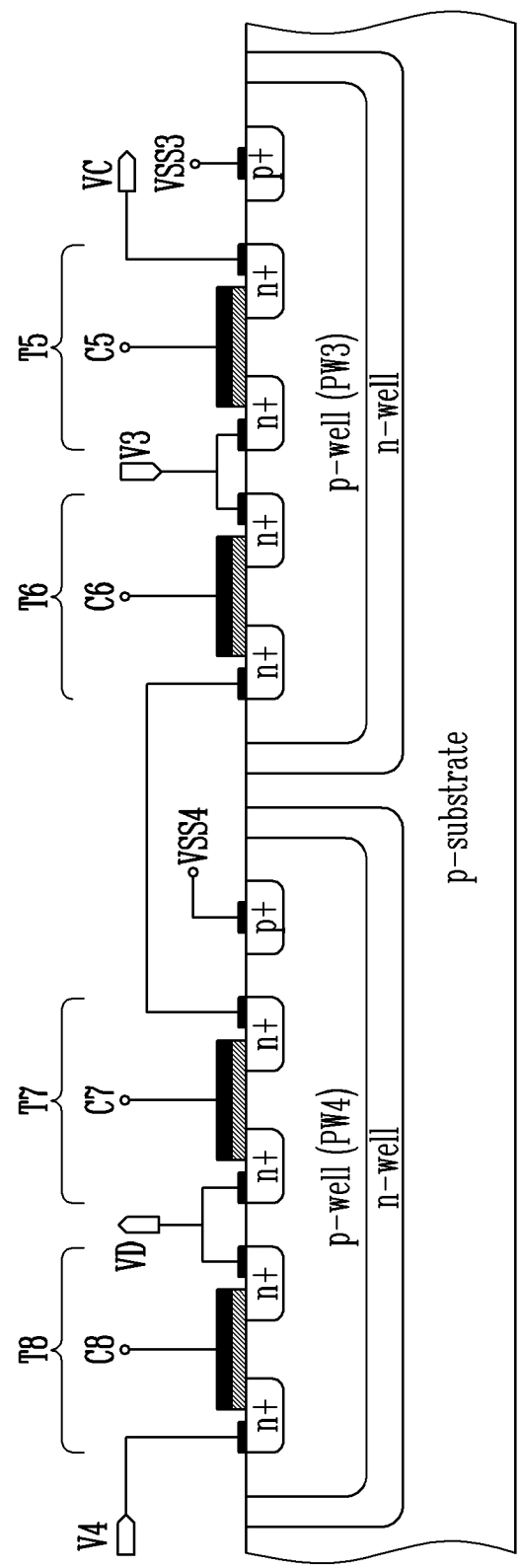
FIG. 9 is a sectional view illustrating a case where transistors shown in FIG. 8 are formed on an actual substrate.

FIG. 8 is a circuit diagram illustrating a voltage switching circuit in accordance with a third embodiment of the present disclosure. FIG. 9 is a sectional view illustrating a case where transistors shown in FIG. 8 are formed on an actual substrate. Hereinafter, the voltage switching circuit in accordance with the third embodiment of the present disclosure will be described with reference to FIGS. 8 and 9 together.

Referring to FIG. 8, the voltage switching circuit in accordance with the third embodiment of the present disclosure is coupled to a third input terminal V3, a fourth input terminal V4, a third output terminal VC, and a fourth output terminal VD. Furthermore, the voltage switching circuit in accordance with the third embodiment of the present disclosure includes fifth to eighth transistors T5 to T8. The fifth to eighth transistors T5 to T8 are respectively controlled by fifth to eighth control signals C5 to C8.

The fifth transistor T5 is coupled between the third input terminal V3 and the third output terminal VC. The sixth and seventh transistors T6 and T7 are sequentially coupled in series between the third input terminal V3 and the fourth output terminal VD. The eighth transistor T8 is coupled between the fourth input terminal V4 and the fourth output terminal VD. Referring to FIG. 9 together with FIG. 8, the third input terminal V3 is coupled to first terminals of the fifth and sixth transistors T5 and T6. A second terminal of the fifth transistor T5 is coupled to the third output terminal VC. A second terminal of the sixth transistor T6 is coupled to a first terminal of the seventh transistor T7. The fourth output terminal VD is coupled to a second terminal of the seventh transistor T7 and a first terminal of the eighth transistor T8. A second terminal of the eighth transistor T8 is coupled to the fourth input terminal V4.

The fifth and sixth transistors T5 and T6 included in the voltage switching circuit in accordance with the third embodiment of the present disclosure are formed on a third p-well PW3. The seventh and eighth transistors T7 and T8 are formed on a fourth p-well PW4.

A body of the fifth and sixth transistors T5 and T6, i.e., the third p-well PW3 on which the fifth and sixth transistors T5 and T6 are formed is coupled to a third VSS terminal VSS3. In addition, a body of the seventh and eighth transistors T7 and T8, i.e., the fourth p-well PW4 on which the seventh and eighth transistors T7 and T8 are formed is coupled to a fourth VSS terminal VSS4. The third and fourth VSS terminals VSS3 and VSS4 may be formed as p+ region doped with a high concentration.

In FIG. 8, when the voltage switching circuit in accordance with the third embodiment of the present disclosure operates in a first mode, a voltage applied to the third input terminal V3 is transferred to the third and fourth output terminals VC and VD. When the voltage switching circuit operates in a second mode, a voltage applied to the third input terminal V3 is transferred to the third output terminal VC, and a voltage applied to the fourth input terminal V4 is transferred to the fourth output terminal VD. The fifth transistor T5 is turned on under both the first mode and the second mode. The sixth and seventh transistors T6 and T7 are turned on in the first mode and are turned off in the second mode. The eighth transistor T8 is turned off in the first mode and is turned on in the second mode. Therefore, the sixth and seventh transistors T6 and T7 which are turned on in the first mode and are turned off in the second mode may be referred to as a "first switching circuit." Moreover, the eighth transistor T8 which is turned off in the first mode and is turned on in the second mode may be referred to as a "second switching circuit."

As shown in FIGS. 8 and 9, according to the voltage switching circuit in accordance with the third embodiment of the present disclosure, the fifth and sixth transistors T5 and T6 are formed on the third p-well PW3. In addition, the seventh and eighth transistors T7 and T8 are formed on the third p-well PW3. Accordingly, the generation of a leakage current can be prevented even when voltages having different polarities are applied to the third input terminal V3 and the fourth input terminal V4 in the second mode.

Figure 10:
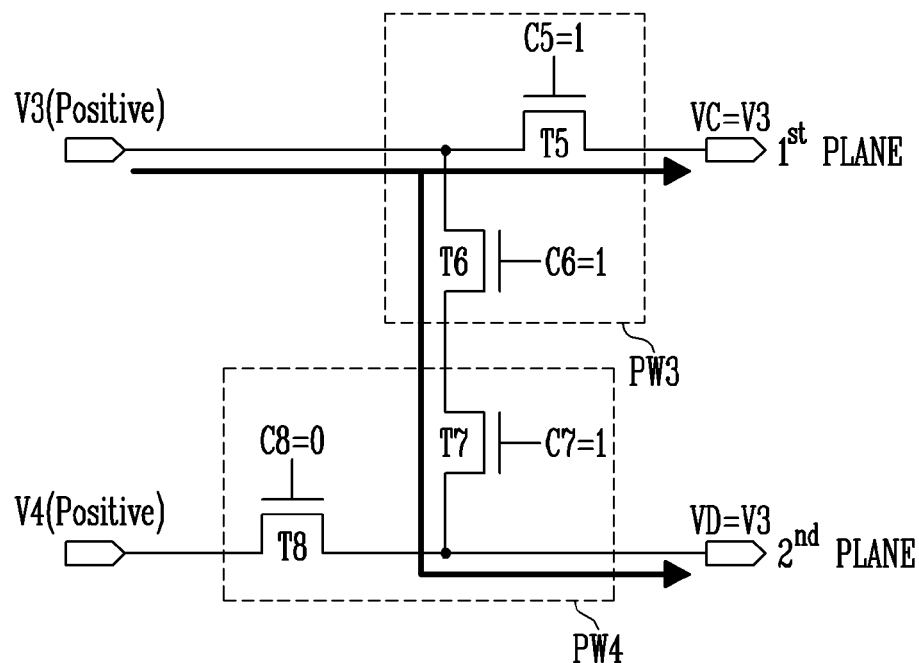
FIG. 10 is a diagram illustrating an operation of the voltage switching circuit in a first mode in accordance with the third embodiment of the present disclosure.

FIG. 10 is a diagram illustrating an operation of the voltage switching circuit in the first mode in accordance with the third embodiment of the present disclosure. When the voltage switching circuit operates in the first mode, a voltage applied to the third input terminal V3 is transferred to the third and fourth output terminals VC and VD. That is, the first switching circuit is activated, and the second switching circuit is inactivated. To this end, the fifth, sixth, and seventh control signals C5, C6, and C7 have a logical value of 1. Accordingly, the fifth, sixth, and seventh transistors T5, T6, and T7 are turned on. Further, a voltage applied to the fourth input terminal V4 may be output to another output terminal (not shown) except the third and fourth output terminals VC and VD. Accordingly, the eighth control signal C8 has a logical value of 0. Therefore, the eighth transistor T8 is turned off.

A case in which positive voltages are applied to the third and fourth input terminals V3 and V4 is described in FIG. 10. Referring to FIG. 9 together with FIG. 10, a ground voltage, i.e., a voltage of 0 may be applied to the third and fourth VSS terminals VSS3 and VSS4 coupled to p+ regions of the third and fourth p-wells PW3 and PW4. Accordingly, a body effect of the fifth to eight transistors T5 to T8 on the third and fourth p-wells PW3 and PW4 can be prevented. Therefore, leakage current is not generated from the voltage switching circuit. Similarly, leakage current is not generated even when the voltage switching circuit operates in the first mode, and negative voltages are applied to the third and fourth input terminals V3 and V4.

When the voltage switching circuit operates in the first mode, and a positive voltage and a negative voltage are respectively applied to the third input terminal V3 and the fourth input terminal V4, a leakage current may be generated. More specifically, when a negative voltage is applied to the fourth input terminal V4 in a case in which a voltage of 0V is applied to the fourth VSS terminal VSS4 coupled to the p+ region of the fourth p-well PW4, a P-N junction diode is formed between the fourth VSS terminal VSS4 which is a p+ doped region of the fourth p-well PW4 and the second terminal of the eighth transistor T8 which is an n+ doped region. Therefore, a leakage current is generated toward the fourth input terminal V4 having a relatively low voltage (negative voltage) from the fourth VSS terminal VSS4 having a relatively high voltage (i.e., 0V).

When the voltage switching circuit operates in the first mode, and a negative voltage and a positive voltage are respectively applied to the third input terminal V3 and the fourth input terminal V4, leakage current may not be generated. However, since a negative voltage is applied to the fourth VSS terminal VSS4, a threshold voltage of the eighth transistor T8 is increased due to the body effect. Therefore, when the voltage switching circuit in accordance with the third embodiment of the present disclosure operates in the first mode, and simultaneously, a negative voltage and a positive voltage are respectively applied to the third input terminal V3 and the fourth input terminal V4, the turn-on and turn-off of the eighth transistor T8 may not be easily controlled.

Figure 11:
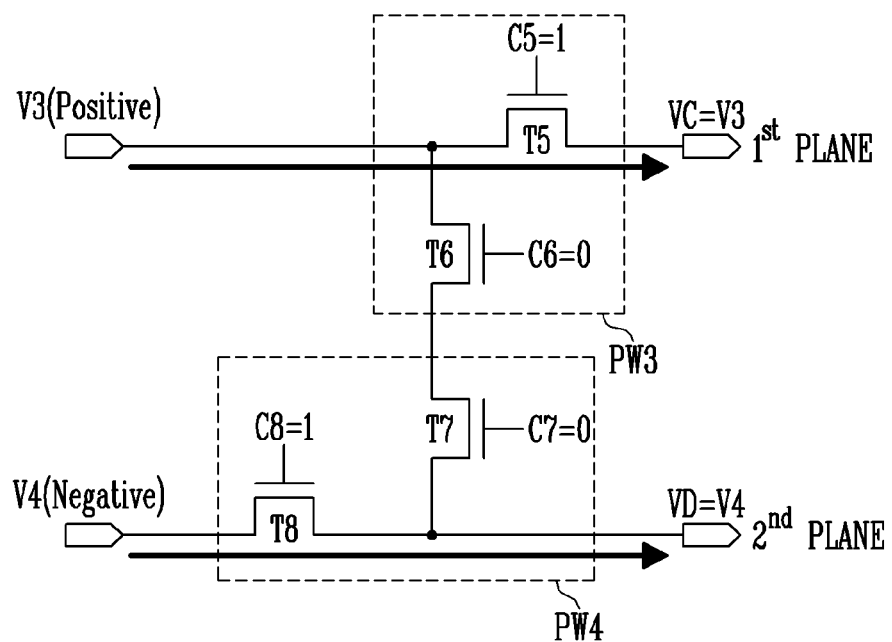
FIG. 11 is a diagram illustrating an operation of the voltage switching circuit in a second mode in accordance with the third embodiment of the present disclosure.

FIG. 11 is a diagram illustrating an operation of the voltage switching circuit in the second mode in accordance with the third embodiment of the present disclosure. When the voltage switching circuit operates in the second mode, a voltage applied to the third input terminal V3 is transferred to the third output terminal VC, and a voltage applied to the fourth input terminal V4 is transferred to the fourth output terminal VD. That is, the first switching circuit is inactivated, and the second switching circuit is activated. To this end, the fifth and eighth control signals C5 and C8 have a logical value of 1. Accordingly, the fifth and eighth transistors T5 and T8 are turned on. Meanwhile, the sixth and seventh control signals C6 and C7 have a logical value of 0, and the sixth and seventh transistors T6 and T7 are turned off.

A case in which a positive voltage is applied to the third input terminal V3 and a negative voltage is applied to the fourth input terminal V4 is described in FIG. 11. Referring to FIG. 9 together with FIG. 11, a ground voltage, i.e., a voltage of 0V may be applied to the third VSS terminal VSS3 coupled to the p+ region of the third p-well PW3. Accordingly, a body effect of the fifth and sixth transistors T5 and T6 on the third p-well PW3 can be prevented.

Since a negative voltage is applied to the fourth input terminal V4, a negative voltage is applied to the fourth VSS terminal VSS4 coupled to the p+ region of the fourth p-well PW4 to prevent the generation of a leakage current. Accordingly, leakage current is not generated between a p+ doping region of the fourth p-well PW4, on which the seventh and eighth transistors T7 and T8 are formed, and the fourth input terminal V4. Since the seventh transistor T7 is in the turn-off state, the negative voltage applied to the fourth input terminal V4 is not transferred to the sixth transistor T6. Accordingly, leakage current is not generated in the third p-well PW3.

Even when a negative voltage is applied to the third input terminal V3 and a positive voltage is applied to the fourth input terminal V4, leakage current is not generated. This is because the sixth and seventh transistors T6 and T7 turned off in the second mode are formed on different p-wells.

In the second mode, leakage current is not generated when positive voltages are applied to both the third and fourth input terminals V3 and V4 or when negative voltages are applied to both the third and fourth input terminals V3 and V4.

The operation mode of the voltage switching circuit in accordance with the third embodiment of the present disclosure and the generation of a leakage current under input terminal conditions are summarized as shown in the following Table 2.

TABLE 2

| Mode | V3 | V3 | VSS3 | VSS4 | Generation of leakage current |
|---|---|---|---|---|---|
| First mode (VC = VD = V3) | (+) Positive | (+) Positive | 0 V | 0 V | X |
| | (+) Positive | (−) Negative | 0 V | (−) | ◯ |
| | (−) Negative | (+) Positive | (−) | 0 V | X |
| | (−) Negative | (−) Negative | (−) | (−) | X |
| Second mode (VC = V3, VD = V4) | (+) Positive | (+) Positive | 0 V | 0 V | X |
| | (+) Positive | (−) Negative | 0 V | (−) | X |
| | (−) Negative | (+) Positive | (−) | 0 V | X |
| | (−) Negative | (−) Negative | (−) | (−) | X |

Thus, in the voltage switching circuit in accordance with the third embodiment of the present disclosure, leakage current is not generated even when voltages having the same polarity or voltages having different polarities are applied to the input terminals V3 and V4 in the second mode. In the voltage switching circuit in accordance with the third embodiment of the present disclosure, leakage current is not generated when voltages having the same polarity are applied to the input terminals V3 and V4 in the first mode.

In the voltage switching circuit in accordance with the third embodiment of the present disclosure, a leakage current may be generated when a positive voltage is applied to the third input terminal V3 and a negative voltage is applied to the fourth input terminal V4 in the first mode. In the voltage switching circuit in accordance with the third embodiment of the present disclosure, the eighth transistor T8 may not be easily controlled due to the body effect, when a negative voltage is applied to the third input terminal V3 and a positive voltage is applied to the fourth input terminal V4 in the first mode.

Referring to Tables 1 and 2 together, in the voltage switching circuit in accordance with the second embodiment of the present disclosure, the polarities of voltages applied to the input terminals V1 and V2 can be freely used in the first mode, but the polarities of voltages applied to the input terminals V1 and V2 are restricted in the second mode. In the voltage switching circuit in accordance with the third embodiment of the present disclosure, the polarities of voltages applied to the input terminals V3 and V4 are restricted in the first mode, but the polarities of voltages applied to the input terminals V3 and V4 can be freely used in the second mode. In accordance with a fourth embodiment which will be described later, the polarities of voltages applied to input terminals can be freely used in first and second modes of a voltage switching circuit.

Figure 12:
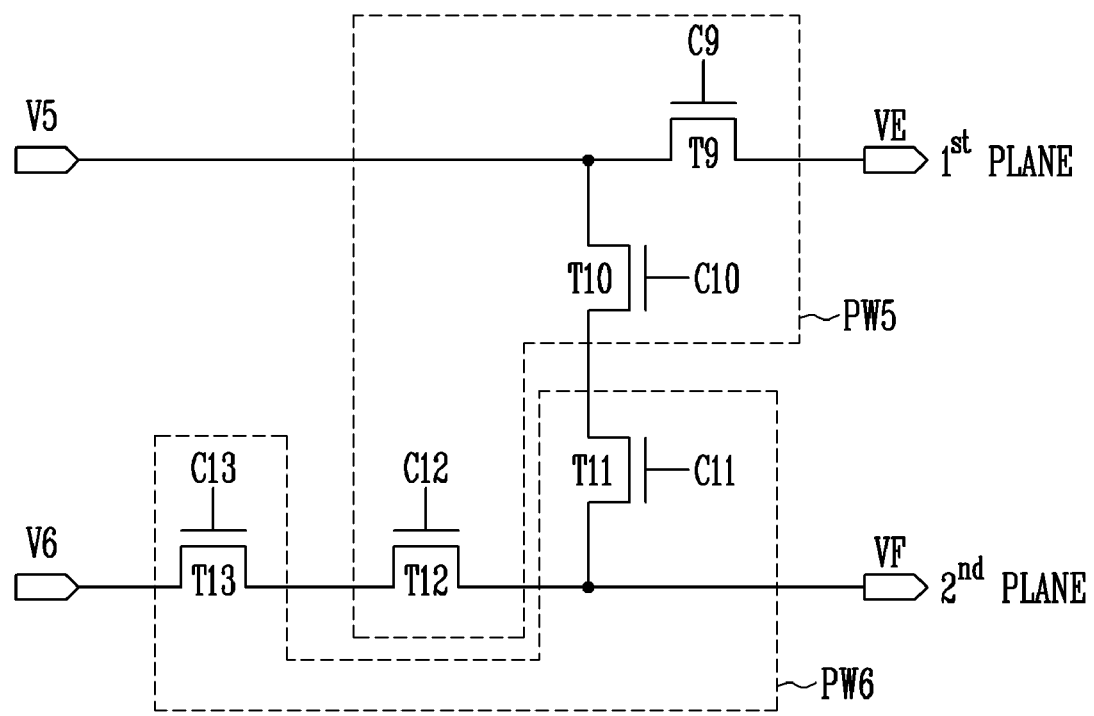
FIG. 12 is a circuit diagram illustrating a voltage switching circuit in accordance with a fourth embodiment of the present disclosure.
Figure 13:
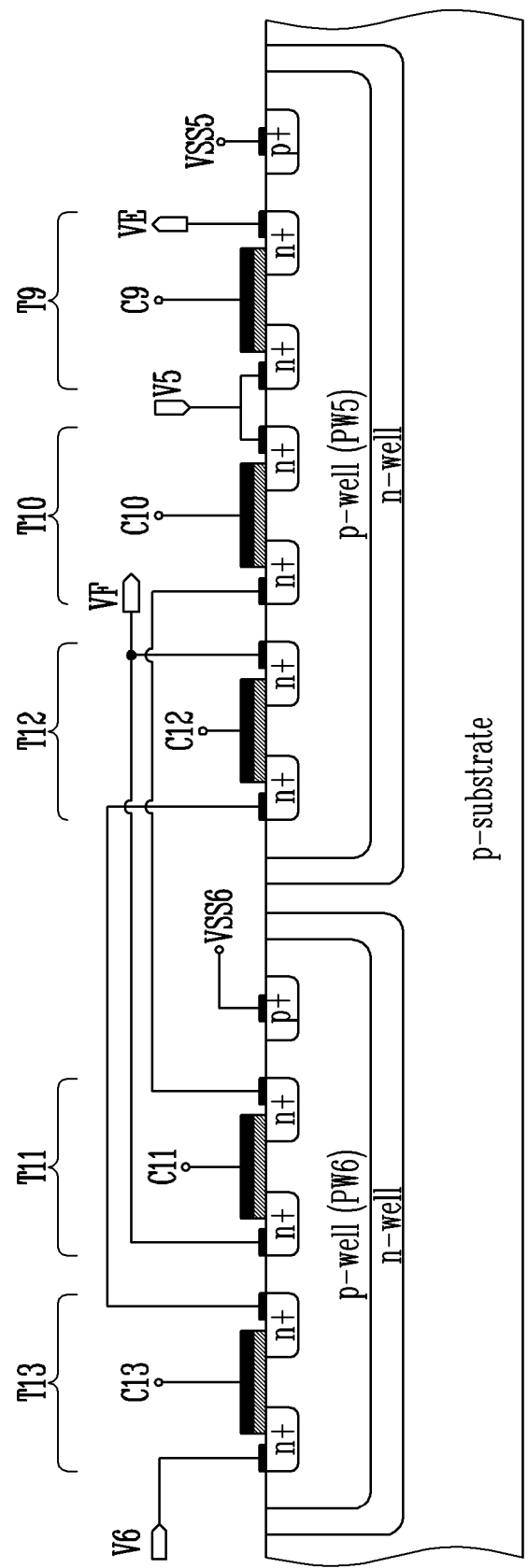
FIG. 13 is a sectional view illustrating a case where transistors shown in FIG. 12 are formed on an actual substrate.

FIG. 12 is a circuit diagram illustrating a voltage switching circuit in accordance with a fourth embodiment of the present disclosure. FIG. 13 is a sectional view illustrating a case where transistors shown in FIG. 12 are formed on an actual substrate. Hereinafter, the voltage switching circuit in accordance with the fourth embodiment of the present disclosure will be described with reference to FIGS. 12 and 13 together.

Referring to FIG. 12, the voltage switching circuit in accordance with the fourth embodiment of the present disclosure is coupled to a fifth input terminal V5, a sixth input terminal V6, a fifth output terminal VE, and a sixth output terminal VF. The voltage switching circuit in accordance with the fourth embodiment of the present disclosure includes a ninth to thirteenth transistors T9 to T13. The ninth to thirteenth transistors T9 to T13 are respectively controlled by ninth to thirteenth control signals C9 to C13.

The ninth transistor T9 is coupled to the fifth input terminal V5 and the fifth output terminal VE. The tenth and eleventh transistors T10 and T11 are sequentially coupled in series between the fifth input terminal V5 and the sixth output terminal VF. The twelfth and thirteenth transistors T12 and T13 are sequentially coupled in series between the sixth output terminal VF and the sixth input terminal V6. Referring to FIG. 13 together with FIG. 12, the fifth input terminal V5 is coupled to first terminals of the ninth and tenth transistors T9 and T10. A second terminal of the ninth transistor T9 is coupled to the fifth output terminal VE. A second terminal of the tenth transistor T10 is coupled to a first terminal of the eleventh transistor T11. The sixth output terminal VF is coupled to a second terminal of the eleventh transistor T11 and a first terminal of the twelfth transistor T12. A second terminal of the twelfth transistor T12 is coupled to a first terminal of the thirteenth transistor T13. The sixth input terminal V6 is coupled to a second terminal of the thirteenth transistor T13.

The ninth, tenth, and twelfth transistors T9, T10, and T12 included in the voltage switching circuit in accordance with the fourth embodiment of the present disclosure are formed on a fifth p-well PW5. The eleventh and thirteenth transistors T11 and T13 are formed on a sixth p-well PW6.

Furthermore, a body of the ninth, tenth, and twelfth transistors T9, T10, and T12, i.e., the fifth p-well PW5 on which the ninth, tenth, and twelfth transistors T9, T10, and T12 are formed is coupled to a fifth VSS terminal VSS5. In addition, a body of the eleventh and thirteenth transistors T11 and T13, i.e., the sixth p-well PW6 on which the eleventh and thirteenth transistors T11 and T13 are formed is coupled to a sixth VSS terminal VSS6. The fifth and sixth VSS terminals VSS5 and VSS6 may be formed as p+ regions doped with a high concentration.

In FIG. 12, when the voltage switching circuit in accordance with the fourth embodiment of the present disclosure operates in a first mode, a voltage applied to the fifth input terminal V5 is transferred to the fifth and sixth output terminals VE and VF. When the voltage switching circuit operates in a second mode, a voltage applied to the fifth input terminal V5 is transferred to the fifth output terminal VE, and a voltage applied to the sixth input terminal V6 is transferred to the sixth output terminal VF. The ninth transistor T9 is turned on under both the first mode and the second mode. The tenth and eleventh transistors T10 and T11 are turned on in the first mode and are turned off in the second mode. The twelfth and thirteenth transistors T12 and T13 are turned off in the first mode and are turned on in the second mode. Therefore, the tenth and eleventh transistors T10 and T11 which are turned on in the first mode and are turned off in the second mode may be referred to as a "first switching circuit." Moreover, the twelfth and thirteenth transistors T12 and T13 which are turned off in the first mode and are turned on in the second mode may be referred to as a "second switching circuit."

As shown in FIGS. 12 and 13, according to the voltage switching circuit in accordance with the fourth embodiment of the present disclosure, the ninth, tenth, and twelfth transistors T9, T10, and T12 are formed on the fifth p-well PW5. In addition, the eleventh and thirteenth transistors T11 and T13 are formed on the sixth p-well PW6. Accordingly, the generation of a leakage current can be prevented even when voltages having different polarities are applied to the fifth input terminal V5 and the sixth input terminal V6 in the first and second modes.

Figure 14:
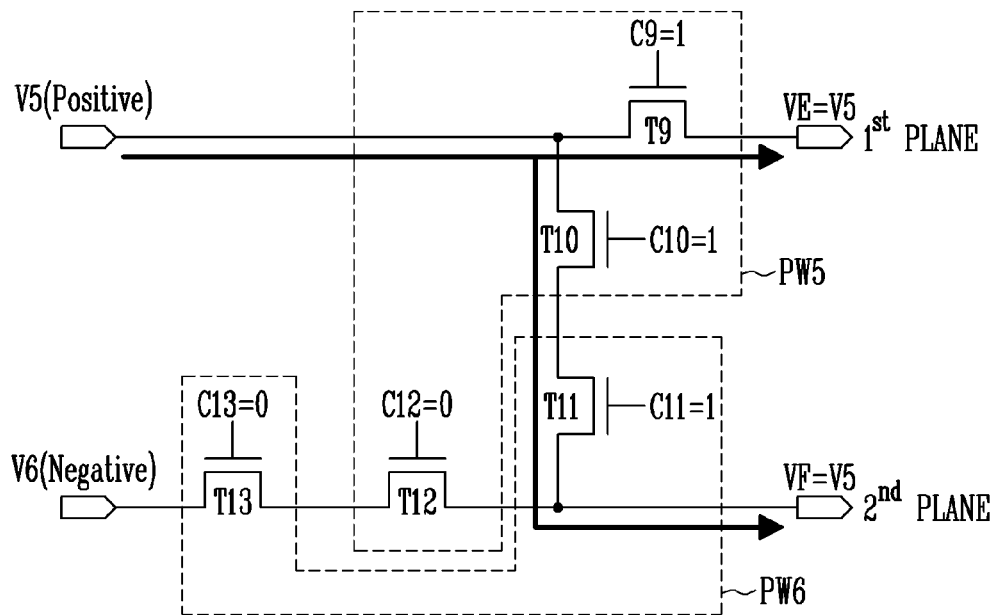
FIG. 14 is a diagram illustrating an operation of the voltage switching circuit in a first mode in accordance with the fourth embodiment of the present disclosure.

FIG. 14 is a diagram illustrating an operation of the voltage switching circuit in the first mode in accordance with the fourth embodiment of the present disclosure. When the voltage switching circuit operates in the first mode, a voltage applied to the fifth input terminal V5 is transferred to the fifth and sixth output terminals VE and VF. That is, the first switching circuit is activated, and the second switching circuit is inactivated. To this end, the ninth, tenth, and eleventh control signals C9, C10, and C11 have a logical value of 1. Accordingly, the ninth, tenth, and eleventh transistors T9, T10, and T11 are turned on. Furthermore, a voltage applied to the sixth input terminal V6 may be output to another output terminal (not shown) except the fifth and sixth output terminals VE and VF. Accordingly, the twelfth and thirteenth control signals C12 and C13 have a logical value of 0. Therefore, the twelfth and thirteenth transistors T12 and T13 are turned off.

A case in which a positive voltage is applied to the fifth input terminal V5 and a negative voltage is applied to the sixth input terminal V6 is described in FIG. 14. Referring to FIG. 13 together with FIG. 14, a ground voltage, i.e., a voltage of 0V may be applied to the fifth VSS terminal VSS5 coupled to a p+ region of the fifth p-well PW5. Accordingly, a body effect of the ninth, tenth, and twelfth transistors T9, T10, and T12 on the fifth p-well PW5 can be prevented.

Since a negative voltage is applied to the sixth input terminal V6, a negative voltage is applied to the sixth VSS terminal VSS6 coupled to a p+ region of the sixth p-well PW6 to prevent the generation of a leakage current. Accordingly, leakage current is not generated between a p+ doping region of the sixth p-well PW6, on which the thirteenth transistor T13 is formed, and the sixth input terminal V6. Since the thirteenth transistor T13 is in the turn-off state, the negative voltage applied to the sixth input terminal V6 is not transmitted to the twelfth transistor T12. Accordingly, leakage current is not generated in the fifth p-well region PW5.

In the operation of the voltage switching circuit in accordance with the fourth embodiment of the present disclosure in the first mode, leakage current is not generated even when a negative voltage is applied to the fifth input terminal V5 and a positive voltage is applied to the sixth input terminal V6. This is because the twelfth and thirteenth transistors T12 and T13 which are turned off in the first mode are formed on different p-wells.

In the first mode, leakage current is not generated even when positive voltages are applied to both the fifth and sixth input terminals V5 and V6 or when negative voltages are applied to both the fifth and sixth input terminals V5 and V6.

Figure 15:
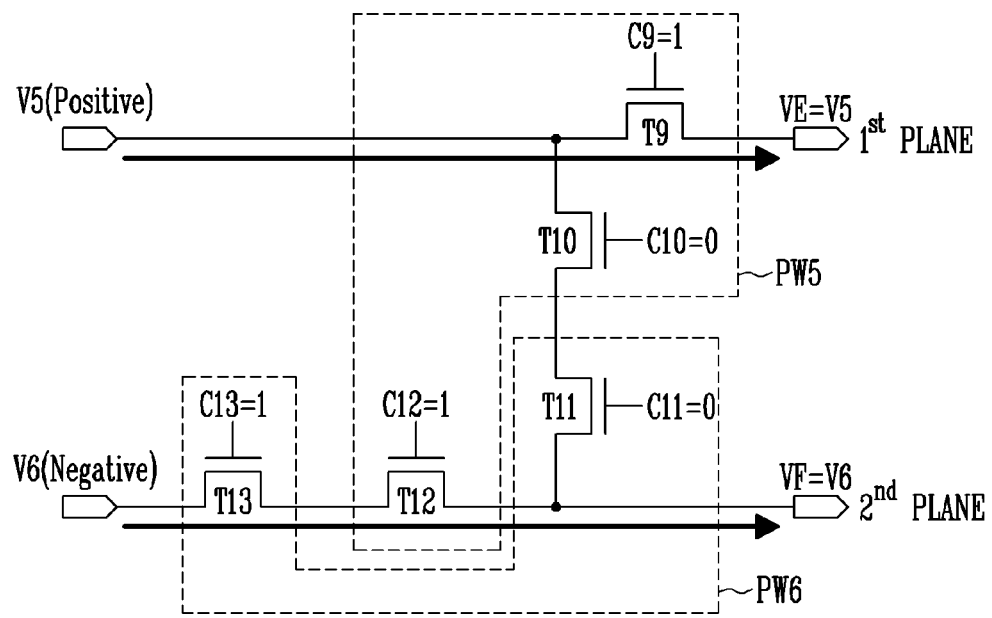
FIG. 15 is a diagram illustrating an operation of the voltage switching circuit in a second mode in accordance with the fourth embodiment of the present disclosure.

FIG. 15 is a diagram illustrating an operation of the voltage switching circuit in the second mode in accordance with the fourth embodiment of the present disclosure. When the voltage switching circuit operates in the second mode, a voltage applied to the fifth input terminal V5 is transferred to the fifth output terminal VE, and a voltage applied to the sixth input terminal V6 is transferred to the sixth output terminal VF. That is, the first switching circuit is inactivated, and the second switching circuit is activated. To this end, the ninth, twelfth, and thirteenth control signals C9, C12, and C13 have a logical value of 1. Accordingly, the ninth, twelfth, and thirteenth transistors T9, T12, and T13 are turned on. Moreover, the tenth and eleventh control signals C10 and C11 have a logical value of 0, and the tenth and eleventh transistors T10 and T11 are turned off.

A case in which a positive voltage is applied to the fifth input terminal V5 and a negative voltage is applied to the sixth input terminal V6 is illustrated in FIG. 15. As shown in FIG. 15, the tenth and eleventh transistors T10 and T11 which are turned off in the second mode are formed on different p-wells, and therefore, any leakage current related to the corresponding transistors is not generated. Meanwhile, unlike FIG. 15, leakage current is not generated even when a negative voltage is applied to the fifth input terminal V5 and a positive voltage is applied to the sixth input terminal V6. Finally, leakage current is not generated even when voltages having the same polarity are applied to the fifth input terminal V5 and the sixth input terminal V6.

The operation mode of the voltage switching circuit in accordance with the fourth embodiment of the present disclosure and the generation of a leakage current under input terminal conditions are summarized as shown in the following Table 3.

TABLE 3

| Mode | V5 | V6 | VSS5 | VSS6 | Generation of leakage current |
|---|---|---|---|---|---|
| First mode (VE = VF = V5) | (+) Positive | (+) Positive | 0 V | 0 V | X |

TABLE 3-continued

| Mode | V5 | V6 | VSS5 | VSS6 | Generation of leakage current |
|---|---|---|---|---|---|
| | (+) Positive | (−) Negative | 0 V | (−) | X |
| | (−) Negative | (+) Positive | (−) | 0 V | X |
| | (−) Negative | (−) Negative | (−) | (−) | X |
| Second mode (VE = V5, VF = V6) | (+) Positive | (+) Positive | 0 V | 0 V | X |
| | (+) Positive | (−) Negative | 0 V | (−) | X |
| | (−) Negative | (+) Positive | (−) | 0 V | X |
| | (−) Negative | (−) Negative | (−) | (−) | X |

Figure 16:
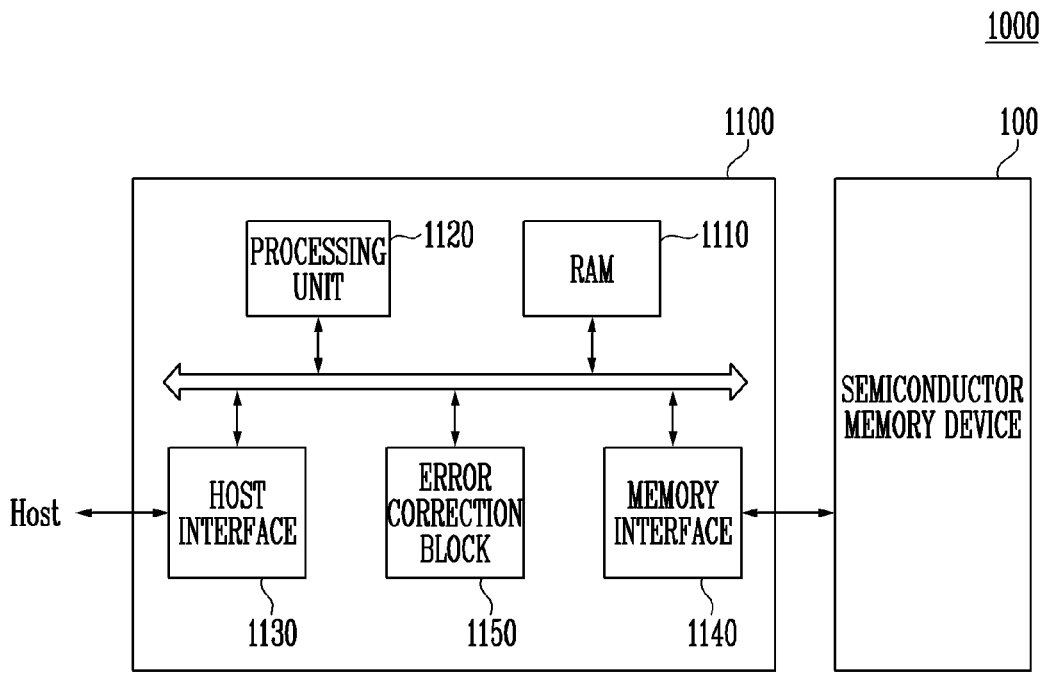
FIG. 16 is a block diagram illustrating a memory system including the semiconductor memory device shown in FIG. 1.

FIG. 16 is a block diagram illustrating a memory system including the semiconductor memory device shown in FIG. 1.

Referring to FIG. 16, the memory system 1000 includes a semiconductor memory device 100 and a controller 1100. The semiconductor memory device 100 may be the semiconductor memory device 100 described with reference to FIG. 1. Hereinafter, overlapping descriptions will be omitted.

The controller 1100 is coupled to a host Host and the semiconductor memory device 100. The controller 1100 accesses the semiconductor memory device 100 in response to a request from the host Host. For example, the controller 1100 controls read, write, erase, and background operations of the semiconductor memory device 100. The controller 1100 provides an interface between the semiconductor memory device 100 and the host Host. The controller 1100 drives firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of a working memory of the processing unit 1120, a cache memory between the semiconductor memory device 100 and the host Host, and a buffer memory between the semiconductor memory device 100 and the host Host. The processing unit 1120 controls overall operations of the controller 1100. In addition, the controller 1100 may temporarily store program data provided from the host Host in a write operation.

The host interface 1130 includes a protocol for exchanging data between the host Host and the controller 1100. In an embodiment, the controller 1100 communicates with the host Host through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory interface 1140 interfaces with the semiconductor memory device 100. For example, the memory interface 1140 may include a NAND interface or a NOR interface.

The error correction block 1150 detects and corrects an error of data received from the semiconductor memory device 100 by using an error correction code (ECC). The processing unit 1120 may adjust a read voltage, based on an error detection result of the error correction block 1150, and control the semiconductor memory device 100 to perform re-reading. In an embodiment, the error correction block 1150 may be provided as a component of the controller 1100.

The controller 1100 and the semiconductor memory device 100 may be integrated into one semiconductor device. In an embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms. For example, the semiconductor memory device 100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 17:
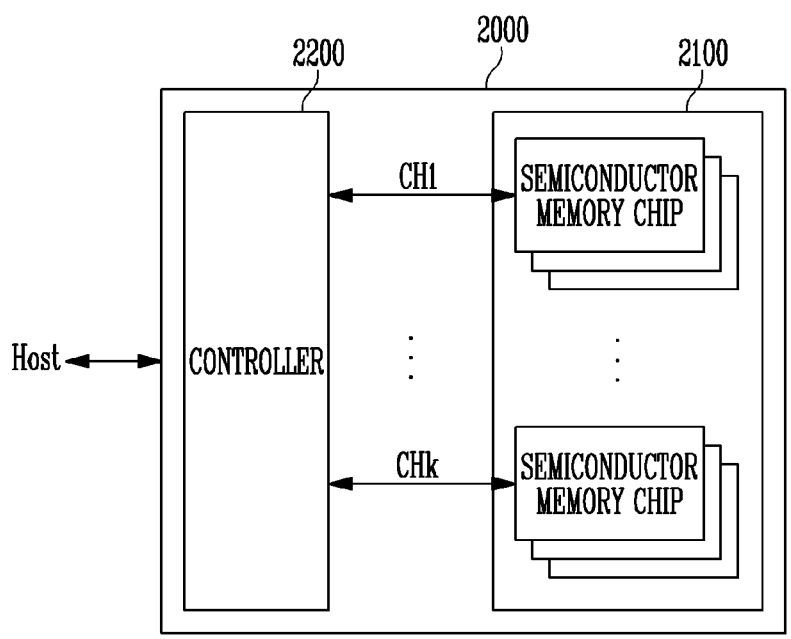
FIG. 17 is a block diagram illustrating an application example of the memory system shown in FIG. 16.

FIG. 17 is a block diagram illustrating an application example of the memory system shown in FIG. 16.

Referring to FIG. 17, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 17, there is illustrated a case where the plurality of groups communicate with the controller 2200 respectively through first to kth channels CH1 to CHk. Each semiconductor memory chip may be configured and operated identically to the semiconductor memory device 100 described with reference to FIG. 1.

Each group communicates with the controller 2200 through one common channel. The controller 2200 is configured identically to the controller 1100 described with reference to FIG. 16. The controller 2200 controls the plurality of memory chips of the semiconductor memory device 2100 through the plurality of channels CH1 to CHk.

Figure 18:
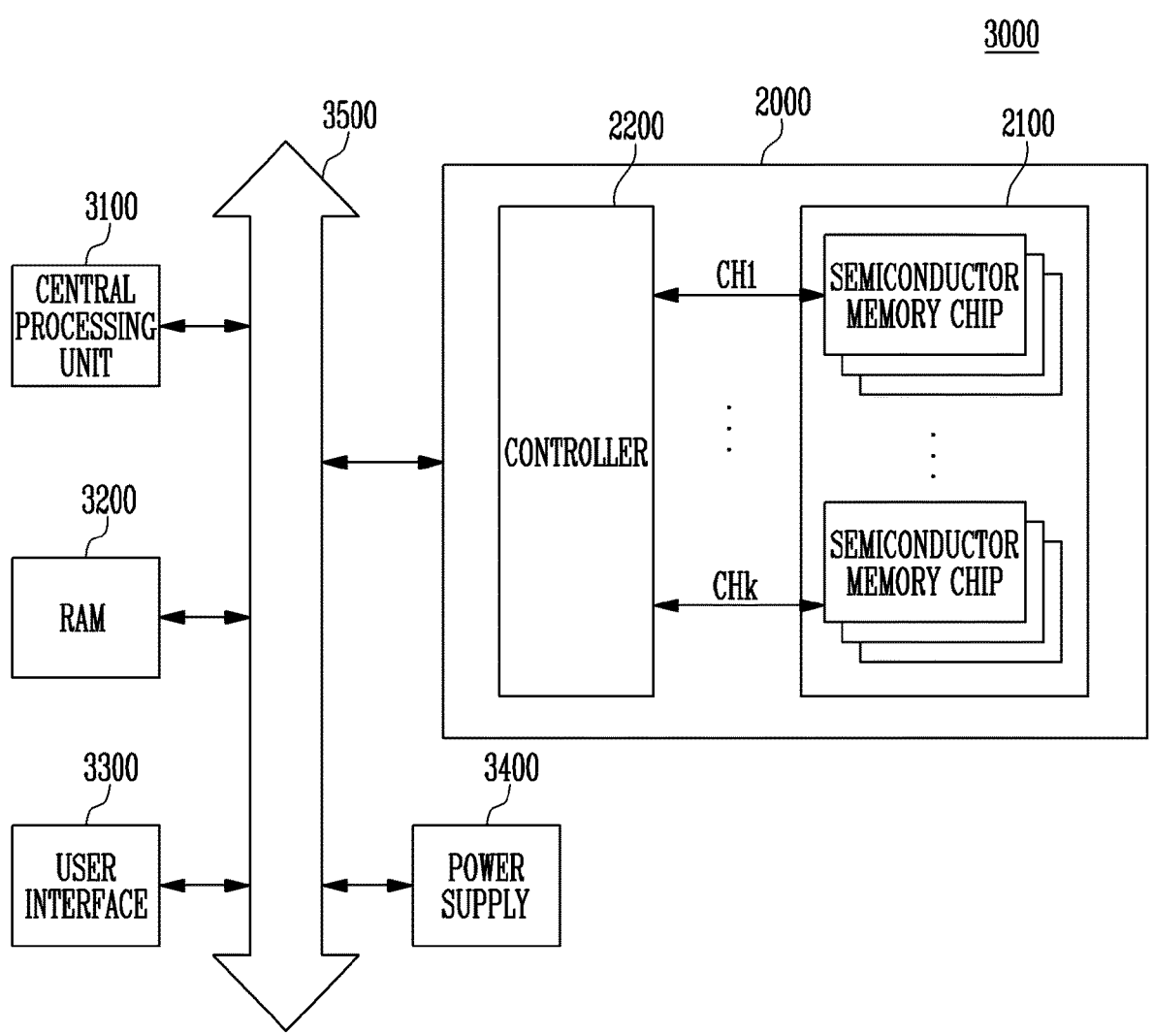
FIG. 18 is a block diagram illustrating a computing system including the memory system described with reference to FIG. 17.

FIG. 18 is a block diagram illustrating a computing system including the memory system described with reference to FIG. 17.

Referring to FIG. 18, the computing system 3000 includes a central processing unit 3100, a RAM 3200, a user interface 3300, a power supply 3400, a system bus 3500, and a memory system 2000.

The memory system 2000 is electrically coupled to the central processing unit 3100, the RAM 3200, the user interface 3300, and the power supply 3400 through the system bus 3500. Data supplied through user interface 3300 or data processed by the central processing unit 3100 are stored in the memory system 2000.

In FIG. 18, there is illustrated a case where the semiconductor memory device 2100 is coupled to the system bus 3500 through the controller 2200. However, the semiconductor memory device 2100 may be directly coupled to the system bus 3500. The function of the controller 2200 may be performed by the central processing unit 3100 and the RAM 3200.

In FIG. 18, there is illustrated a case where the memory system 2000 described with reference to FIG. 17 is provided. However, the memory system 2000 may be replaced by the memory system 1000 described with reference to FIG. 16. In an embodiment, the computing system 3000 may include both of the memory systems 1000 and 2000 described with reference to FIGS. 16 and 17.

In accordance with the present disclosure, there can be provided a voltage switching circuit capable of stably providing a negative voltage and a positive voltage to a plurality of planes.

In accordance with the present disclosure, there can be provided a semiconductor memory device capable of stably providing a negative voltage and a positive voltage to a plurality of planes.

While the present disclosure has been shown and described with reference to embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A voltage switching circuit for selectively transferring voltages applied to a first input terminal and a second input terminal to a first output terminal and a second output terminal, the voltage switching circuit comprising:
   a first transistor formed on a first well on a substrate, the first transistor being coupled between the first input terminal and the first output terminal; and
   a second transistor formed on a second well different from the first well, the second transistor being coupled to the second input terminal,
   wherein, in a first mode in which a first voltage applied to the first input terminal is transferred to the first output terminal and the second output terminal, the first transistor is turned on and the second transistor is turned off, and
   wherein the first output terminal and the second output terminal are connected to different planes.

2. The voltage switching circuit of claim 1, wherein, in a second mode in which the first voltage applied to the first input terminal is transferred to the first output terminal and a second voltage applied to the second input terminal is transferred to the second output terminal, the first transistor is turned on and the second transistor is turned on.

3. The voltage switching circuit of claim 2,
   further comprising a third transistor and a fourth transistor, which are formed on the first well,
   wherein the third transistor is coupled between the first input terminal and the second output terminal,
   wherein the fourth transistor is coupled between the second transistor and the second output terminal,
   wherein, in the first mode, the third transistor is turned on and the fourth transistor is turned off, and
   wherein, in the second mode, the third transistor is turned off and the fourth transistor is turned on.

4. The voltage switching circuit of claim 3, wherein, in the first mode, the first voltage and the second voltage have different polarities.

5. The voltage switching circuit of claim 2,
   further comprising a third transistor formed on the first well and a fourth transistor formed on the second well,
   wherein the third transistor and the fourth transistor are coupled in series between the first input terminal and the second output terminal,
   wherein, in the first mode, the third transistor and the fourth transistor are turned on, and
   wherein, in the second mode, the third transistor and the fourth transistor are turned off.

6. The voltage switching circuit of claim 5, wherein, in the second mode, the first voltage and the second voltage have different polarities.

7. The voltage switching circuit of claim 2,
   further comprising a third transistor and a fourth transistor, which are formed on the first well, and a fifth transistor formed on the second well, wherein the third transistor and the fifth transistor are coupled in series between the first input terminal and the second output terminal wherein the fourth transistor is coupled between the second transistor and the second output terminal, wherein, in the first mode, the third transistor and the fifth transistor are turned on, and the fourth transistor is turned off, and wherein, in the second mode, the third transistor and the fifth transistor are turned off, and the fourth transistor is turned on.

8. The voltage switching circuit of claim 7, wherein, in the first mode, the first voltage and the second voltage have different polarities.

9. The voltage switching circuit of claim 7, wherein, in the second mode, the first voltage and the second voltage have different polarities.

10. The voltage switching circuit of claim 1, wherein the first well and the second well are p-wells.

11. A voltage switching circuit for selectively transferring voltages applied to a first input terminal and a second input terminal to a first output terminal and a second output terminal, the voltage switching circuit comprising:
a first switching circuit configured to selectively transfer a first voltage applied to the first input terminal to the second output terminal; and
a second switching circuit configured to selectively transfer a second voltage applied to the second input terminal to the second output terminal,
wherein the first voltage is transferred to the first output terminal, and
wherein at least one transistor included in the first switching circuit is formed on a well different from that on which at least one transistor included in the second switching circuit is formed, and
wherein the first output terminal and the second output terminal are connected to different planes.

12. The voltage switching circuit of claim 11,
wherein, in a first mode, the first switching circuit is activated and the second switching circuit is inactivated, and
wherein, in a second mode, the first switching circuit is inactivated and the second switching circuit is activated.

13. The voltage switching circuit of claim 12,
wherein the first switching circuit includes a first transistor coupled between the first input terminal and the second output terminal,
wherein the second switching circuit includes:
a second transistor coupled to the second input terminal; and
a third transistor coupled between the second transistor and the second output terminal, and wherein the first transistor and the third transistor are formed on a first well, and the second transistor is formed on a second well different from the first well.

14. The voltage switching circuit of claim 13, wherein, in the first mode, the first voltage and the second voltage have different polarities.

15. The voltage switching circuit of claim 12,
wherein the first switching circuit includes:
a first transistor coupled to the first input terminal; and
a second transistor coupled between the first transistor and the second output terminal,
wherein the second switching circuit includes a third transistor coupled between the second input terminal and the second output terminal, and
wherein the first transistor is formed on a first well, and the second transistor and the third transistor are formed on a second well different from the first well.

16. The voltage switching circuit of claim 15, wherein, in the second mode, the first voltage and the second voltage have different polarities.

17. The voltage switching circuit of claim 12,
wherein the first switching circuit includes:
a first transistor coupled to the first input terminal; and
a second transistor coupled between the first transistor and the second output terminal,
wherein the second switching circuit includes:
a third transistor coupled to the second input terminal; and
a fourth transistor coupled between the third transistor and the second output terminal, and
wherein the first transistor and the fourth transistor are formed on a first well, and the second transistor and the third transistor are formed on a second well different from the first well.

18. The voltage switching circuit of claim 17, wherein, in the first mode, the first voltage and the second voltage have different polarities.

19. The voltage switching circuit of claim 17, wherein, in the second mode, the first voltage and the second voltage have different polarities.

20. A switching circuit comprising:
a first transistor configured to transfer a first voltage from a first input node to a first output node;
second and third transistors configured to transfer, when turned on, a second voltage from a second input node to a second output node; and
a fourth transistor configured to transfer, when turned on, the first voltage to the second output node,
wherein the second transistor is formed on a different well from the first, third and fourth transistors, and
wherein the first and second voltages have different polarities, and
wherein the first output node and the second output node are connected to different planes.

* * * * *